(12) United States Patent
Kobayashi et al.

(10) Patent No.: US 11,277,122 B2
(45) Date of Patent: Mar. 15, 2022

(54) D-TYPE FLIP-FLOP CIRCUIT

(71) Applicants: NATIONAL UNIVERSITY CORPORATION KYOTO INSTITUTE OF TECHNOLOGY, Kyoto (JP); Dolphin Design, Meylan (FR)

(72) Inventors: Kazutoshi Kobayashi, Kyoto (JP); Jun Furuta, Kyoto (JP); Kodai Yamada, Kyoto (JP)

(73) Assignees: National University Corporation Kyoto Institute of Technology, Kyoto (JP); Dolphin Design, Meylan (FR)

(*) Notice: Subject to any disclaimer, the term of this patent is extended or adjusted under 35 U.S.C. 154(b) by 0 days.

(21) Appl. No.: 17/059,602

(22) PCT Filed: May 30, 2019

(86) PCT No.: PCT/JP2019/021613
§ 371 (c)(1),
(2) Date: Nov. 30, 2020

(87) PCT Pub. No.: WO2019/235363
PCT Pub. Date: Dec. 12, 2019

(65) Prior Publication Data
US 2021/0226616 A1 Jul. 22, 2021

(30) Foreign Application Priority Data
Jun. 4, 2018 (JP) .............................. JP2018-106763

(51) Int. Cl.
*H03K 3/3562* (2006.01)
*H01L 27/12* (2006.01)
*H01L 21/762* (2006.01)

(52) U.S. Cl.
CPC ..... *H03K 3/35625* (2013.01); *H01L 27/1203* (2013.01); *H01L 21/76243* (2013.01)

(58) Field of Classification Search
CPC ............ H03K 3/35625; H01L 27/1203; H01L 21/76243
See application file for complete search history.

(56) References Cited

FOREIGN PATENT DOCUMENTS

| JP | 2004-64557 A | 2/2004 |
| JP | 2014-155163 A | 8/2014 |
| JP | 2015-12424 A | 1/2015 |
| JP | 2017-41675 A | 2/2017 |

OTHER PUBLICATIONS

Zhang et al., Temperature Dependence of Soft-Error Rates for FF designs in 20-nm Bulk Planar and 16-nm Bulk FinFET Technologies, IEEE, 2016.
Balasubramanian et al., RHBD Techniques for Mitigating Effects of Single-Event Hits Using Guard-Gates, IEEE Transactions on Nuclear Science, vol. 52, No. 6, Dec. 2005, pp. 2531-2535.

*Primary Examiner* — Dinh T Le
(74) *Attorney, Agent, or Firm* — Noblitt & Newson, PLLC

(57) ABSTRACT

A D-type flip-flop circuit 1 has a structure in which a pMOS transistor p8 and an nMOS transistor n8 are added to a general D-type flip-flop circuit comprising pMOS transistors p1 to p7, p11 to p15 and nMOS transistors n1 to n7, n11 to n15.

6 Claims, 21 Drawing Sheets

D-TYPE FLIP-FLOP CIRCUIT

TECHNICAL FIELD

The present invention relates to a D-type flip-flop circuit, in particular to a D-type flip-flop circuit with improved tolerance to a soft error.

BACKGROUND

Integrated circuits (LSI) have become high-performance through miniaturization and high integration, and thus can be advanced in a cycle of improvement in computer performance and progress in miniaturization. However, with the miniaturization of processes, temporary errors represented by soft errors have increased. Soft errors are a problem for integrated circuits used in cosmic space exposed to harsh cosmic rays. However, in recent years, measures against soft errors have also become necessary on the ground. A soft error refers to an error due to electron-hole pairs that are generated when radiation passes through or collides with an integrated circuit and then the holding value of a memory or the logic value of a flip-flop is temporarily inverted.

FIG. 14 shows the principle of occurrence of a soft error. When a neutron beam collides with a Si atom of a substrate, a secondary ion is generated. When a α ray, a heavy ion, and a secondary ion pass through the vicinity of a diffusion layer, the drift caused by the electric field of a diffusion and depletion layer causes an electron or a hole to accumulate in the diffusion layer. The electron or hole causes the potential of the drain to change and the output of the drain is inverted.

As shown in FIGS. 15 and 16, when radiation passes through the transistors constituting a latch circuit, the charge generated by the ionization of the radiation causes the high (high level) and low (low level) of the output of the transistor to temporarily invert. The circuit malfunctions when the output of the transistor stabilizes in the inverted state.

Therefore, it is particularly necessary to take countermeasures against soft errors for integrated circuits used in medical devices, airplanes and automobiles that require high reliability, or servers and supercomputers with large scale circuits. Furthermore, due to the integration in the miniaturization of the integrated circuits and the reduction of power supply potential in recent years, the influence of soft errors has been exposed. For future integrated circuits, countermeasures against soft errors are indispensable.

As a countermeasure against soft errors, a method to deal with it at the circuit level and a method to deal with it at the device level of the circuit are considered.

As a countermeasure at the circuit level, a countermeasure based on a structure in which a storage element (a flip-flop circuit) are multiplexed can be introduced.

FIG. 17 shows the tripling of a flip-flop (FF) circuit, i.e., a TMRFF (Triple Modular Redundancy Flip Flop) with a majority voting circuit connected to the outputs of all flip-flop circuits. In TMRFF, even if one of the three flip-flop circuits cause the outputted high and low to be inverted due to a soft error, as long as the other two maintain the correct output values, the majority voting circuit outputs a correct signal based on majority vote. In this way, by multiplexing a flip-flop circuit, the tolerance to a soft error is enhanced. However, due to the tripling of a flip-flop circuit, compared with the general D-type flip-flop circuit, the circuit area, delay time and power consumption of TMRFF are increased to about 5.2 times, 1.5 times and 3.2 times respectively.

In this way, in the circuit-level countermeasure, although reliability is improved, there are problems of large area, delay time, and power consumption cost.

By comparison, as a countermeasure at the device level, a countermeasure with a structure, in which a so-called FD-SOI (Fully Depleted Silicon On Insulator) based on a layer of insulator provided between a silicon substrate and a transistor (surface silicon), can be introduced.

As shown in FIG. 18, in the FD-SOI structure, an insulating layer called a BOX (Buried Oxide) layer is provided between the silicon substrate and the transistor. As the BOX layer, $SiO_2$ is mainly used. As a result, since the collection of charges to the drain can be suppressed in the BOX layer, the tolerance to a soft error is increased by about 50 to 100 times compared with the bulk structure.

However, even the FD-SOI structure has the problem of the soft error caused by parasitic bipolar effects. Specifically, as shown in FIG. 19, in the case of an nMOS transistor, when the parasitic bipolar transistor turns ON due to a hole remaining in the substrate, a charge is collected in the drain, and the holding value is inverted.

Therefore, for an adequate soft error countermeasure, the device-level countermeasure based on the FD-SOI structure and the circuit-level countermeasure need to be combined.

As one of such countermeasures, a non-multiplexing countermeasure using a C component has been proposed (Non-patent reference 1). As shown in FIG. 20, the C component comprises a pMOS transistor p101, a pMOS transistor p102, an nMOS transistor n101, and a pMOS transistor p102 connected between the power supply potential and the reference potential. By means of a delay circuit constituted by inverters IN103 and IN104A, an input In2 for the pMOS transistor p102 and the nMOS transistor n101 is delayed with respect to an input In1 for the pMOS transistor p101 and nMOS transistor n102. Therefore, even if a pulse caused by a soft error occurs instantaneously in the inverter IN105, since the pMOS transistor p101 and the pMOS transistor p102, and the nMOS transistor n101 and the nMOS transistor n102 do not switch simultaneously, the output OUT does not change.

Furthermore, as shown in FIG. 21, even if only the nMOS transistor n101 is turned ON due to the parasitic bipolar effect, as long as the nMOS transistor n102 is OFF, the output OUT does not change. By using such a non-multiplexing countermeasure with a FD-SOI structure and a C component, tolerance to a soft error can be improved.

In Non-patent reference 2, a D-type flip-flop circuit (Guard-Gate Flip Flop) that implements a non-multiplexing countermeasure using a C component is proposed. FIG. 22 is a circuit diagram of a general D-type flip-flop circuit 10, and FIG. 23 is a circuit diagram of a D-type flip-flop circuit 20 disclosed in Non-patent reference 2.

The D-type flip-flop circuit 10 is a TGFF (Transmission Gate Flip Flop). As shown in FIG. 22, it comprises a master latch LA11, a transmission gate TG, a slave latch LA12, a tri-state inverter T3, an inverter IN10 and a clock signal generation circuit CL. The master latch LA11 comprises: an inverter IN1 with a pMOS transistor p1 and an nMOS transistor n1; and a tri-state inverter T11 with a pMOS transistor p2, a pMOS transistor p3, an nMOS transistor n2 and an nMOS transistor n3. When CLK=1, the master latch LA11 is used to hold the value. The latch LA12 comprises: an inverter IN2 with a pMOS transistor p5 and an nMOS transistor n5; and a tri-state inverter T12 with a pMOS transistor p6, a pMOS transistor p7, an nMOS transistor n6 and an nMOS transistor n7. When CLK=0, the slave latch LA12 is used to hold the value.

In the D-type flip-flop circuit 10, when the output of any one of the MOSs constituting the inverter IN1 or the output of any one of the MOSs constituting the tri-state inverter T11 is inverted due to a soft error, the holding value of the master latch LA11 changes. Similarly, when the output of any one of the MOSs constituting the inverter IN2 or the output of any one of the MOSs constituting the tri-state inverter T12 is inverted due to a soft error, the holding value of the slave latch LA12 changes.

Therefore, the D-type flip-flop circuit 20 shown in FIG. 23 has the following structure that can be obtained by replacing the inverter IN1 and the inverter IN2 in the general D-type flip-flop circuit 10 with the C component C1 and the C component C2, respectively, and then providing a delay circuit with inverters IN21 and IN22 in one input of the C component C1, and providing a delay circuit with inverters IN23 and IN24 in one input of the C component C2. In this way, the D-type flip-flop circuit 20 applies a non-multiplexing countermeasure using a C component to the general D-type flip-flop circuit 10, thereby enhancing the tolerance to a soft error.

PRIOR ART REFERENCES

Non-Patent References

Non-patent reference 1: A. Balasubramanian et al., "RHBD Techniques for Mitigating Effects of Single-Event Hits Using Guard-Gates", IEEE TRANSACTIONS ON NUCLEAR SCIENCE, VOL. 52, NO. 6, DECEMBER 2005, p. 2531-2535;

Non-patent reference 2: H. Zhang et al., "Temperature Dependence of Soft-Error Rates for FF designs in 20-nm Bulk Planar and 16-nm Bulk FinFET Technologies", 2016 IEEE International Reliability Physics Symposium (IRPS).

SUMMARY

Problem to be Solved by the Present Invention

The D-type flip-flop circuit 20 shown in FIG. 23 is provided with enhanced tolerance to a soft error. However, since a total of 12 MOS transistors p21 to p26 and n21 to n26 are added to the general D-type flip-flop circuit 10, the circuit area becomes larger. Furthermore, since a delay circuit is provided in the C component, the delay time becomes long, and the circuit cannot be applied to a system using a high-frequency clock.

The present invention has been proposed to solve the above-mentioned problems. The subject matter thereof is to provide a D-type flip-flop circuit, which suppresses the increase in circuit area and delay time and has higher tolerance to a soft error, compared to the conventional D-type flip-flop circuit with enhanced tolerance to a soft error.

Solution for Solving the Problem

In order to solve the problem, a D-type flip-flop circuit according to the present invention comprises: a master latch, a transmission gate and a slave latch. The master latch comprises a first inverter and a first tri-state inverter. The first inverter comprises a first pMOS transistor and a first nMOS transistor. One of a source and a drain of the first pMOS transistor is connected to a power supply potential. One of a source and a drain of the first nMOS transistor is connected to the other of the source and the drain of the first pMOS transistor, the other of the source and the drain of the first nMOS transistor is grounded, and a gate of the first nMOS transistor is connected to a gate of the first pMOS transistor. The first tri-state inverter comprises a second pMOS transistor, a third pMOS transistor, a second nMOS transistor, and a third nMOS transistor. One of a source and a drain of the second pMOS transistor is connected to the power supply potential. One of a source and a drain of the third pMOS transistor is directly or indirectly connected to the other of the source and drain of the second pMOS transistor, and the other of the source and the drain of the third pMOS transistor is directly or indirectly connected to a first node, and an inverted clock signal is inputted to a gate of the third pMOS transistor. The first node is connected to the gate of the first pMOS transistor and the gate of the first nMOS transistor, and the first node, the gate of the first pMOS transistor and the gate of the first nMOS transistor together constitute an input part of the master latch. One of a source and a drain of the second nMOS transistor is directly or indirectly connected to the first node, and a clock signal is inputted to a gate of the second nMOS transistor. One of a source and a drain of the third nMOS transistor is directly or indirectly connected to the other of the source and the drain of the second nMOS transistor, and the other of the source and the drain of the third nMOS transistor is grounded. A gate of the second pMOS transistor and a gate of the third nMOS transistor are connected to each other to constitute an output part of the master latch, and are connected to the other of the source and the drain of the first pMOS transistor and to the one of the source and the drain of the first nMOS transistor. The transmission gate comprises a fourth pMOS transistor and a fourth nMOS transistor. One of a source and a drain of the fourth pMOS transistor and one of a source and a drain of the fourth nMOS transistor are connected to each other to constitute an input part of the transmission gate, and are connected to the output part of the master latch. The other of the source and the drain of the fourth pMOS transistor and the other of the source and the drain of the fourth nMOS transistor are connected to each other to constitute an output part of the transmission gate. The slave latch comprises a second inverter and a second tri-state inverter. The second inverter comprises a fifth pMOS transistor and a fifth nMOS transistor. One of a source and a drain of the fifth pMOS transistor is connected to the power supply potential. One of a source and a drain of the fifth nMOS transistor is connected to the other of the source and the drain of the fifth pMOS transistor, the other of the source and drain of the fifth nMOS transistor is grounded, and a gate of the fifth nMOS transistor is connected to a gate of the fifth pMOS transistor. The second tri-state inverter comprises a sixth pMOS transistor, a seventh pMOS transistor, a sixth nMOS transistor, and a seventh nMOS transistor. One of a source and a drain of the sixth pMOS transistor is connected to the power supply potential. One of a source and a drain of the seventh pMOS transistor is directly or indirectly connected to the other of the source and the drain of the sixth pMOS transistor, and the other of the source and the drain of the seventh pMOS transistor is directly or indirectly connected to a second node, and a clock signal is inputted to a gate of the seventh pMOS transistor. The second node is connected to the gate of the fifth pMOS transistor and the gate of the fifth nMOS transistor, and the second node, the gate of the fifth pMOS transistor and the gate of the fifth nMOS transistor together constitute an input part of the slave latch. One of a source and a drain of the sixth nMOS transistor is directly or indirectly connected to the second node, and an inverted clock signal is inputted to a gate of the sixth nMOS transistor. One of a source and a drain of the seventh nMOS transistor is directly or indirectly connected to the other of the source and the drain of the sixth nMOS transistor, and the other of the source and the drain of the seventh nMOS transistor is grounded. A gate of the sixth pMOS transistor and a gate of the seventh nMOS transistor are connected to each other to constitute an output part of the slave latch, and are connected to the other of the source and the drain of the fifth pMOS transistor, the one of the source and the drain of the fifth nMOS transistor, and the output part of the transmission gate. In the D-type flip-flop circuit, the first tri-state inverter further comprises an eighth pMOS transistor and an eighth nMOS transistor. One and the other of a source and a drain of the eighth pMOS transistor are respectively connected to the other of the source and the drain of the second pMOS transistor and the one of the source and the drain of the third pMOS transistor, or respectively connected to the other of the source and the drain of the third pMOS transistor and the first node. One and the other of a source and a drain of the eighth nMOS transistor are respectively connected to the other of the source and the drain of the second nMOS transistor and the one of the source and the drain of the third nMOS transistor, or respectively connected to the first node and the one of the source and the drain of the second nMOS transistor. A gate of the eighth pMOS transistor and a gate of the eighth nMOS transistor are connected to each other, and are connected to a connection between the other of the source and the drain of the sixth pMOS transistor and the other of the source and the drain of the seventh pMOS transistor and a connection between the other of the source and the drain of the sixth nMOS transistor and the one of the source and the drain of the seventh nMOS transistor.

Effect of the Invention

The present invention can provide a D-type flip-flop circuit with high tolerance to a soft error as compared with the conventional D-type flip-flop circuit with enhanced tolerance to a soft error, while suppressing an increase in circuit area and delay time.

DETAILED DESCRIPTION

Hereinafter, embodiments of the present invention will be described with reference to the drawings.

Figure 1:
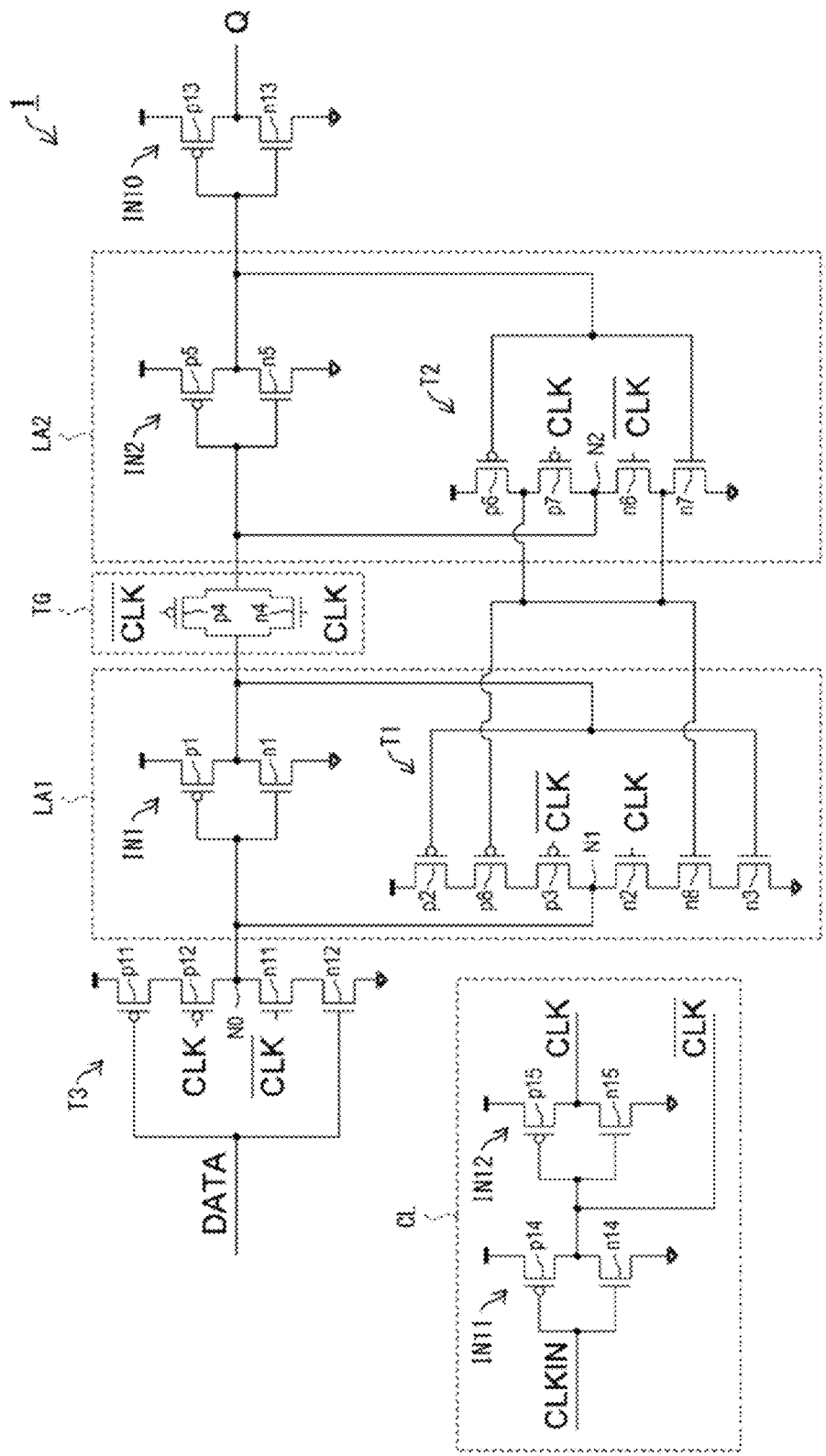
FIG. 1 is a circuit diagram of a D-type flip-flop circuit according to an embodiment of the present invention.

FIG. 1 is a circuit diagram of a D-type flip-flop circuit 1 according to an embodiment of the present invention. The D-type flip-flop circuit 1 comprises a tri-state inverter T3, a master latch LA1, a transmission gate TG, a slave latch LA2, an inverter IN10, and a clock signal generation circuit CL.

The tri-state inverter T3 comprises a pMOS transistor p11, a pMOS transistor p12, an nMOS transistor n11, and an nMOS transistor n12 connected in series sequentially from a power supply potential side to GND, i.e., a reference potential side. A control clock signal (CLK) is inputted to the gate of the pMOS transistor p12, and an inverted clock signal (CLK with "overline") is inputted to the gate of the nMOS transistor n11. The tri-state inverter T3 comprises a node NO as an output part.

The master latch LA1 comprises an inverter IN1 and a tri-state inverter T1. The inverter IN1 comprises a pMOS transistor p1 and an nMOS transistor n1. The source (one of the source and the drain) of the pMOS transistor p1 is connected to a power supply potential, the drain (one of the source and the drain) of the nMOS transistor n1 is connected to the drain (the other of the source and the drain) of the pMOS transistor p1, and the source (the other of the source and the drain) of the nMOS transistor n1 is grounded. The gate of the nMOS transistor n1 is connected to the gate of the pMOS transistor p1. The tri-state inverter T1 comprises a pMOS transistor p2, a pMOS transistor p3, an nMOS transistor n2, and an nMOS transistor n3. The source (one of the source and the drain) of the pMOS transistor p2 is connected to the power supply potential, and the source (one of the source and the drain) of the pMOS transistor p3 is directly or indirectly connected to the drain (the other of the source and the drain) of the pMOS transistor p2, the drain (the other of the source and the drain) of the pMOS transistor p3 is directly or indirectly connected to a node N1, and an inverted clock signal is inputted to the gate of the pMOS transistor p3. The node N1 is connected to the gate of the pMOS transistor p1 and the gate of the nMOS transistor n1, and this node, the gate of the pMOS transistor p1 and the gate of the nMOS transistor n1 together constitute an input part of the master latch LA1. The drain (one of the source and the drain) of the nMOS transistor n2 is directly or indirectly connected to the node N1, and a clock signal is inputted to the gate of the nMOS transistor n2. The drain (one of the source and the drain) of the nMOS transistor n3 is directly or indirectly connected to the source (the other of the source and the drain) of the nMOS transistor n2, and the source (the other of the source and the drain) of the nMOS transistor n3 is grounded. The gate of the pMOS transistor p2 and the gate of the nMOS transistor n3 are connected to each other to constitute an output part of the master latch LA1, and are connected to the drain (the other of the source and the drain) of the pMOS transistor p1 and the drain (the one of the source and the drain) of the nMOS transistor n1.

Figure 22:
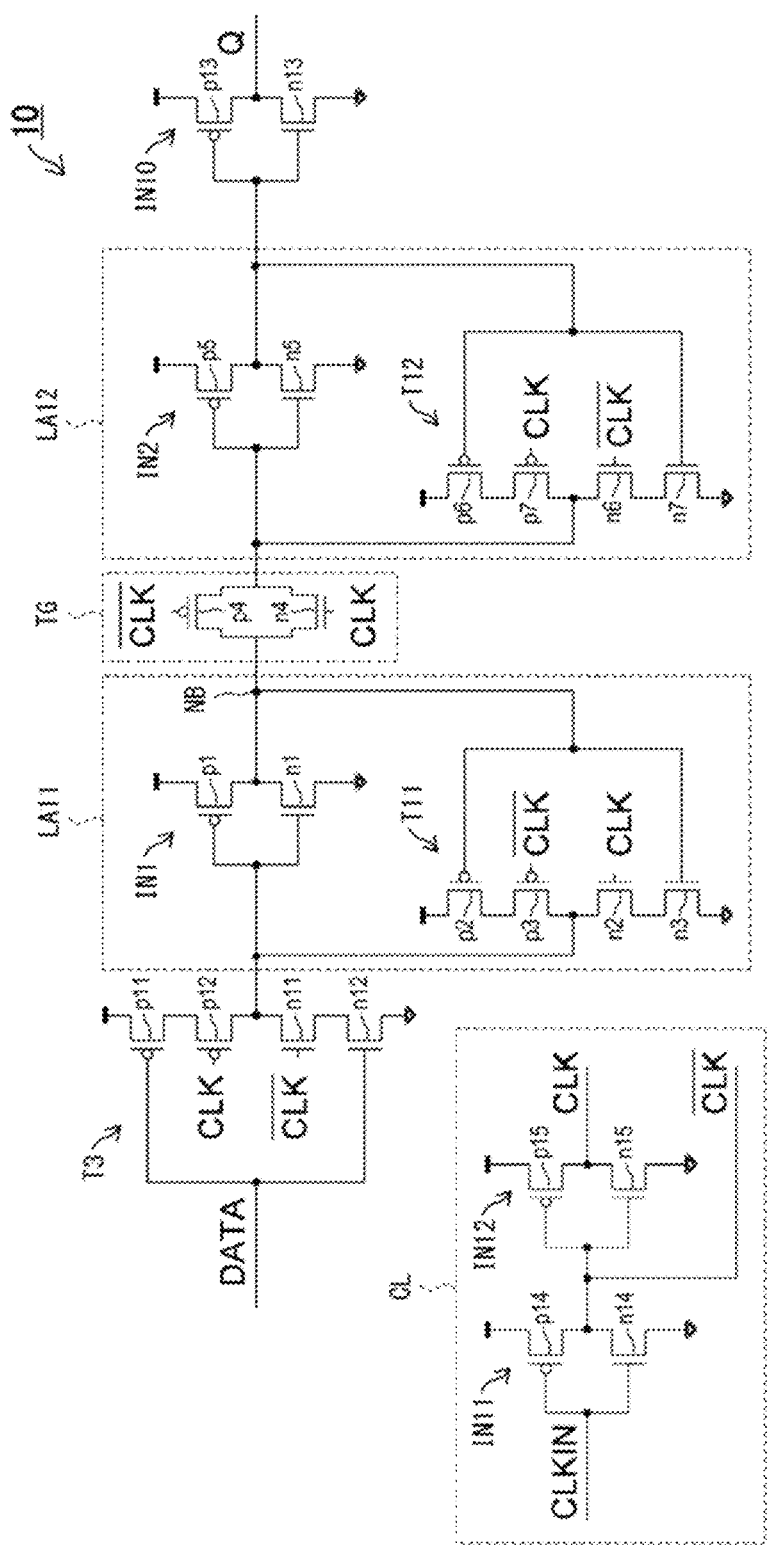
FIG. 22 is a circuit diagram of a general D-type flip-flop circuit.

The structure of the master latch LA1 is the same as that of the master latch LA11 of the general D-type flip-flop circuit 10 shown in FIG. 22, but in the master latch LA1 of the D-type flip-flop circuit 1 according to the embodiment, the tri-state inverter T1 further comprises a pMOS transistor p8 and an nMOS transistor n8. The connection between the pMOS transistor p8 and the nMOS transistor n8 will be described below.

The transmission gate TG comprises a pMOS transistor p4 and an nMOS transistor n4. The source (one of the source and the drain) of the pMOS transistor p4 and the source (one of the source and the drain) of the nMOS transistor n4 are connected to each other to constitute an input part of the transmission gate TG, and are connected to the output part of the master latch LA1. The drain (the other of the source and the drain) of the pMOS transistor p4 and the drain (the other of the source and the drain) of the nMOS transistor n4 are connected to each other to constitute an output part of the transmission gate TG.

The slave latch LA2 comprises an inverter IN2 and a tri-state inverter T2. The inverter IN2 comprises a pMOS transistor p5 and an nMOS transistor n5. The source (one of the source and the drain) of the pMOS transistor p5 is connected to the power supply potential, and the drain (one of the source and the drain) of the nMOS transistor n5 is connected to the drain (the other of the source and the drain) of the pMOS transistor p5, the source (the other of the source and the drain) of the nMOS transistor n5 is grounded. The gate of the nMOS transistor n5 is connected to the gate of the pMOS transistor p5. The tri-state inverter T2 comprises a pMOS transistor p6, a pMOS transistor p7, an nMOS transistor n6, and an nMOS transistor n7. The source (one of the source and the drain) of the pMOS transistor p6 is connected to the power supply potential, and the source (one of the source and the drain) of the pMOS transistor p7 is directly or indirectly connected to the drain (the other of the source and the drain) of the pMOS transistor p6, the drain (the other of the source and the drain) of the pMOS transistor p7 is directly or indirectly connected to a node N2, and a clock signal is inputted to the gate of the pMOS transistor p7. The node N2 is connected to the gate of the pMOS transistor p5 and the gate of the nMOS transistor n5, and this node, the gate of the pMOS transistor p5 and the gate of the nMOS transistor N5 together constitute an input part of the slave latch LA2, and is connected to the output part of the transmission gate TG. The drain (one of the source and the drain) of the nMOS transistor N6 is directly or indirectly connected to the node N2, and an inverted clock signal is inputted to the gate of the nMOS transistor n6. The drain (one of the source and the drain) of the nMOS transistor n7 is directly or indirectly connected to the source (the other of the source and the drain) of the nMOS transistor n6, and the source (the other of the source and the drain) of the nMOS transistor n7 is grounded. The gate of the pMOS transistor p6 and the gate of the nMOS transistor n7 are connected to each other to constitute the output part of the slave latch LA2, and are connected to the drain (the other of the source and the drain) of the pMOS transistor p5 and the drain (the one of the source and the drain) of the nMOS transistor n5.

The structure of the slave latch LA2 is the same as the slave latch LA12 of the general D-type flip-flop circuit 10 shown in FIG. 22.

The inverter IN10 comprises a pMOS transistor p13 and an nMOS transistor n13. The pMOS transistor p13 and the nMOS transistor n13 are connected in series sequentially from the power supply potential side to the reference potential side. Specifically, the source of the pMOS transistor p13 is connected to the power supply potential, and the drain of the pMOS transistor p13 is connected to the drain of the nMOS transistor n13. The source of the nMOS transistor n13 is grounded. The connection between the drain of the pMOS transistor p13 and the drain of the nMOS transistor n13 constitutes the output part of the inverter IN10. A gate of the pMOS transistor p13 and a gate of the nMOS transistor n13 are connected to each other and also connected to the output part of the slave latch LA2.

A clock signal generation circuit CL is a circuit that generates a clock signal and an inverted clock signal, and comprises a two-stage inverter IN11 and an inverter IN12. The inverter IN11 comprises a pMOS transistor p14 and an nMOS transistor n14. The gate of the pMOS transistor p14 and the gate of the nMOS transistor n14 are connected by a connection wiring, and a clock signal to the inverter IN11 is inputted at the connection wiring. The source of the pMOS transistor p14 is connected to the power supply potential, and the drain of the pMOS transistor p14 is connected to a drain of the nMOS transistor n14, and this connection constitutes an output part for the signal from the inverter IN11. The source of the nMOS transistor n14 is connected to the reference potential as GND. The inverter IN12 comprises a pMOS transistor p15 and an nMOS transistor n15. The gate of the pMOS transistor p15 and the gate of the nMOS transistor n15 are connected by a connection wiring, and the connection wiring is connected to the output part of the inverter IN11. The source of the pMOS transistor p15 is connected to the power supply potential, and the drain of the pMOS transistor p15 is connected to the drain of the nMOS transistor n15, and this connection constitutes an output part for the signal from the inverter IN12. The source of the nMOS transistor n15 is connected to the reference potential. According to the above structure, the clock signal generation circuit CL outputs an inverted clock signal from the inverter IN11 and a clock signal from the inverter IN12.

In the structure of the D-type flip-flop circuit 1 described above, the tri-state inverter T3, the transmission gate TG, the inverter IN10, and the clock signal generation circuit CL are the same as those of the general D-type flip-flop circuit 10 shown in FIG. 22. In another aspect, as described above, the tri-state inverter T1 of the master latch LA1 further comprises the pMOS transistor p8 and the nMOS transistor n8, which is different from the master latch LA11 of the D-type flip-flop circuit 10.

Specifically, the source (one of the source and the drain) and the drain (the other of the source and the drain) of the pMOS transistor p8 are respectively connected to the drain (the one of the source and the drain) of the pMOS transistor p2 and the source (the one of the source and the drain) of the pMOS transistor p3. Furthermore, the drain (the one of the source and the drain) and the source (the other of the source and the drain) of the nMOS transistor n8 are respectively connected to the source (the other of the source and the drain) of the nMOS transistor n2 and the drain (the one of the source and the drain) of the nMOS transistor n3. Furthermore, the gate of the pMOS transistor p8 and the gate of the nMOS transistor n8 are connected to each other, and connected to the drain (the other of the source and the drain) of the pMOS transistor p6 and the drain (the one of the source and the drain) of the nMOS transistor n7 of the tri-state inverter T2.

Figure 23:
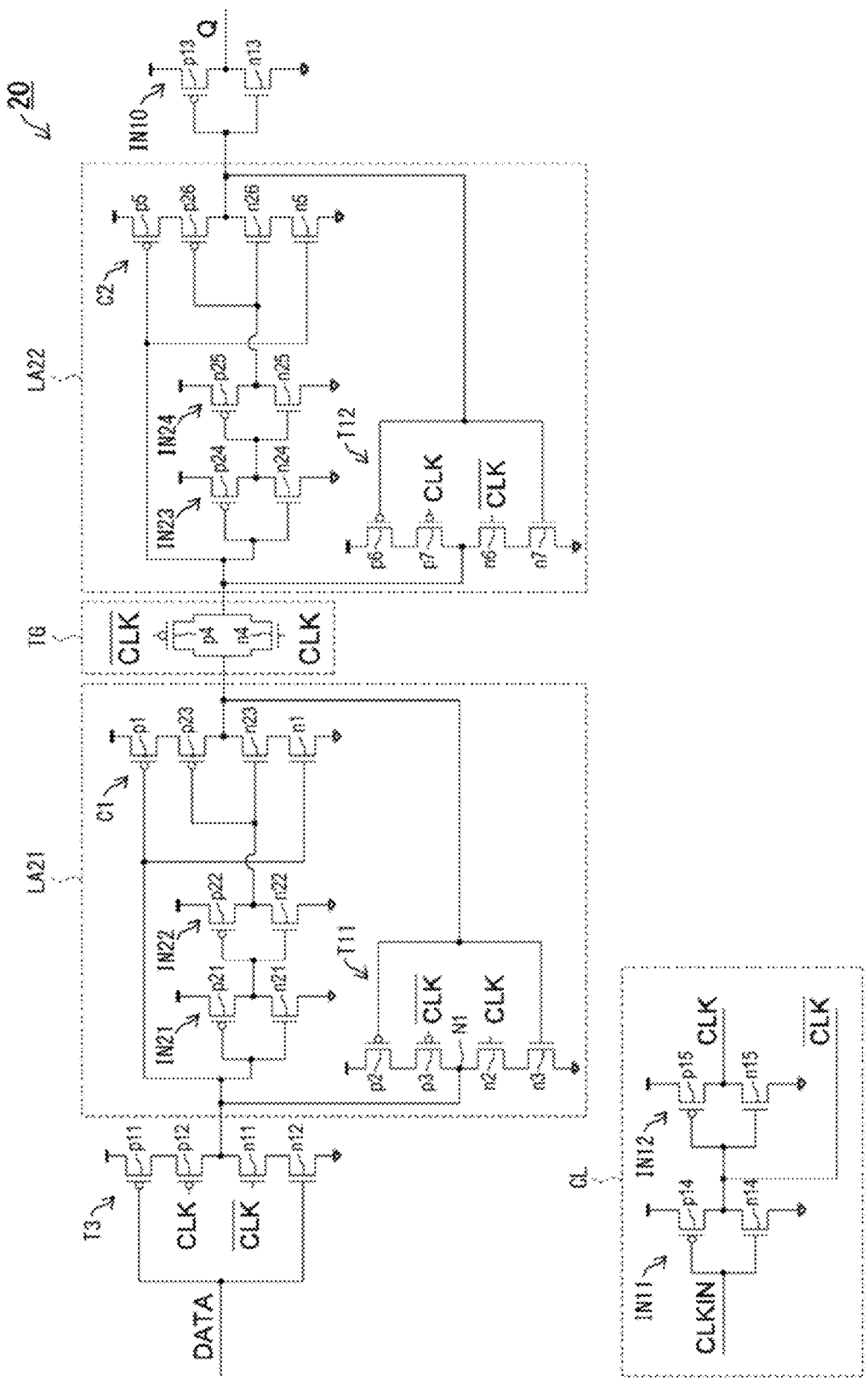
FIG. 23 is a circuit diagram of a conventional D-type flip-flop circuit with enhanced tolerance to a soft error.

As described above, the D-type flip-flop circuit 1 according to the embodiment is configured such that a total of two MOSs, i.e., the pMOS transistor p8 and the nMOS transistor n8 are added in the general D-type flip-flop circuit 10 shown in FIG. 22. In contrast, the conventional D-type flip-flop circuit 20 shown in FIG. 23 is configured with enhanced tolerance to soft errors by adding a total of 12 MOSs in the D-type flip-flop circuit 10. Therefore, compared with the D-type flip-flop circuit 20, the D-type flip-flop circuit 1 can greatly suppress an increase in the circuit area. Furthermore, compared with the D-type flip-flop circuit 20, the delay time can also be reduced for the D-type flip-flop circuit 1 since it does not comprise a delay circuit.

Furthermore, the master latch LA1 of the D-type flip-flop circuit 1 has the same tolerance to a soft error as the master latch LA21 of the D-type flip-flop circuit 20. The mechanism for suppressing a soft error in the D-type flip-flop circuit 1 will be described below based on FIGS. 2 to 8.

Figure 2:
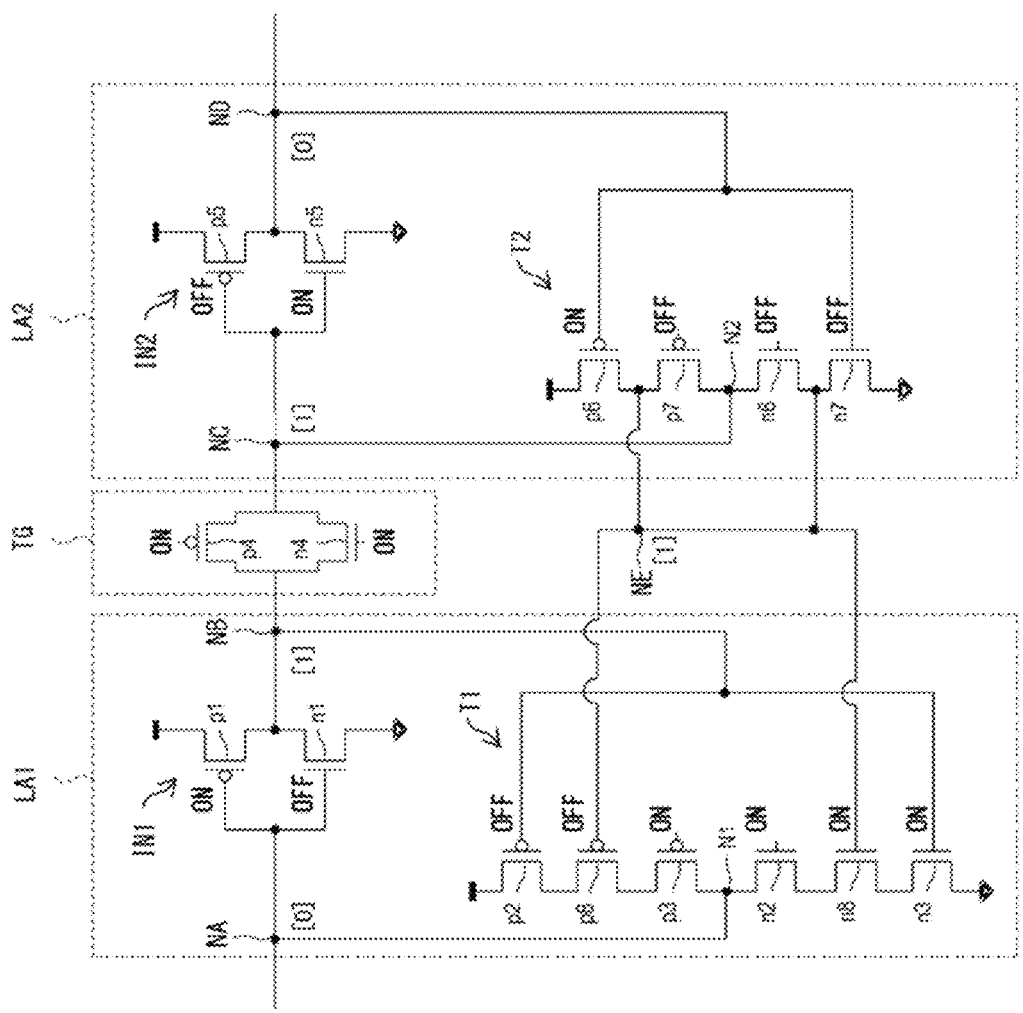
FIG. 2 is a diagram illustrating a mechanism for suppressing a soft error of the D-type flip-flop circuit.

FIG. 2 shows the master latch LA1, the transmission gate TG, and the slave latch LA2 of the D-type flip-flop circuit 1, in which, initial states of values are kept by the master latch LA1 when CLK=1. In the figure, the potentials of the nodes NA, NB, NC, ND, and NE are indicated as [1] in the case of a high level, and indicated as [0] in the case of a low level. Furthermore, the state of each MOS is indicated as ON in the case of a conductive state, and indicated as OFF in the case of a non-conductive state. Potentials of the nodes NA, NB, NC, ND, and NE are [0], [1], [1], [0], [1] in the initial states, and the holding value of the master latch LA1 is [1].

Figure 3:
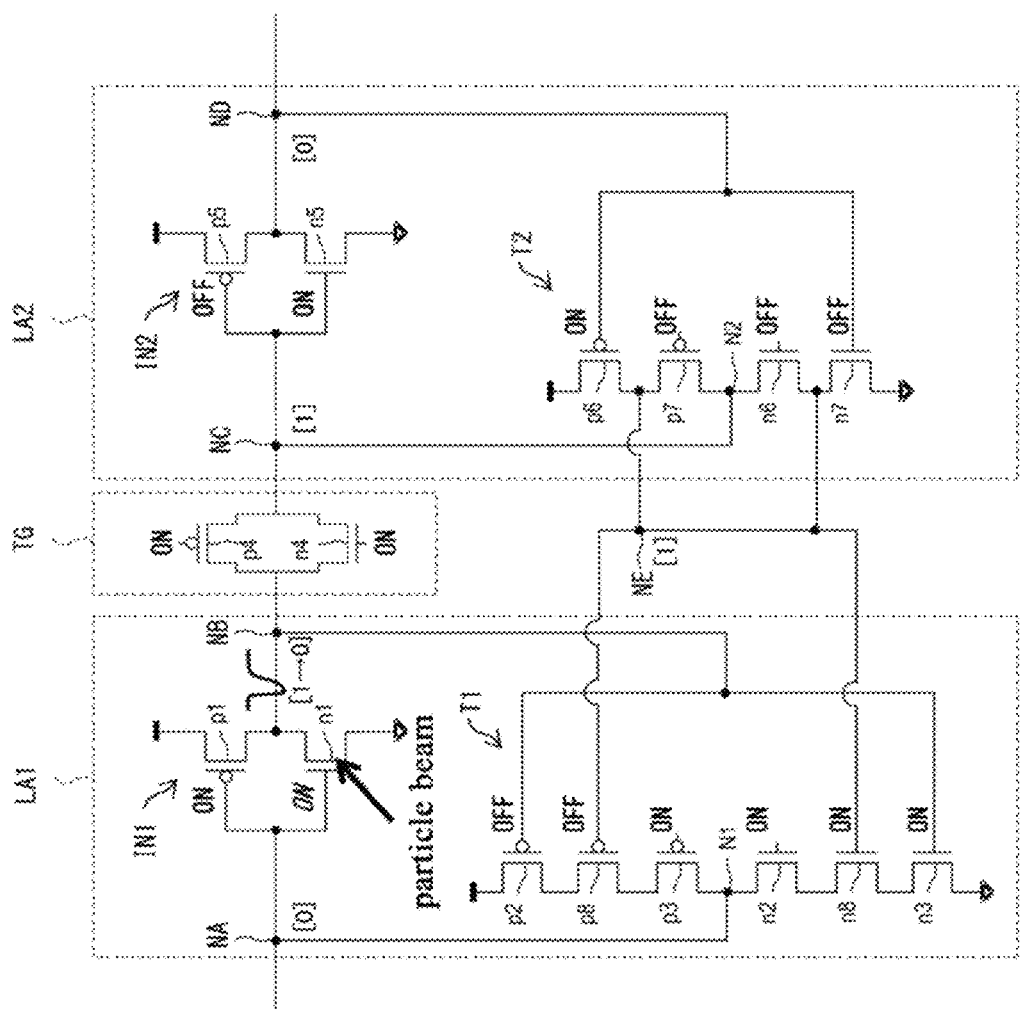
FIG. 3 is a diagram illustrating the mechanism for suppressing the soft error of the D-type flip-flop circuit.

Here, as shown in FIG. 3, a particle beam collides with the nMOS transistor n1 of the master latch LA1, and the soft error causes an inversion from OFF to ON. Thus, a pulse is instantaneously generated, and the potential of the node NB is switched from [1] to [0]. Furthermore, in FIGS. 3 to 8, the inverted state of a MOS is indicated by italic characters.

Figure 4:
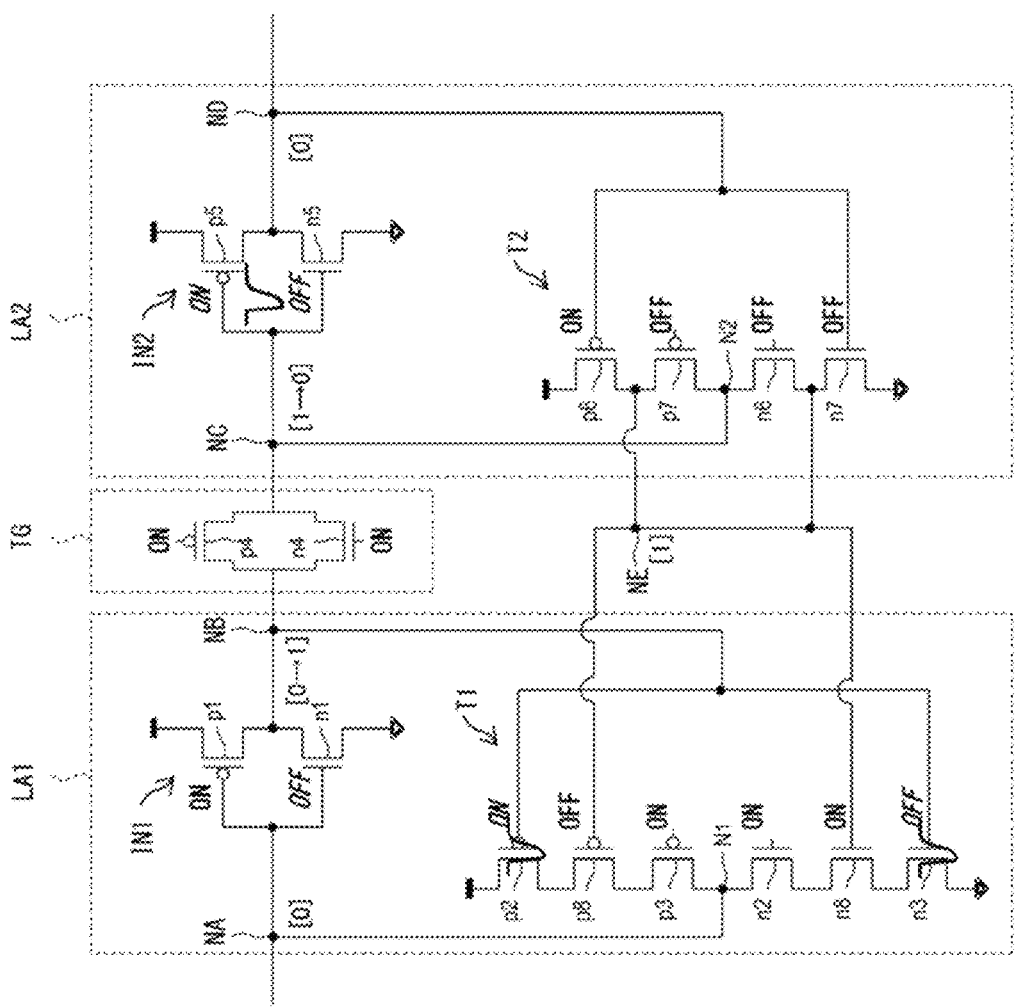
FIG. 4 is a diagram illustrating the mechanism for suppressing the soft error of the D-type flip-flop circuit.

Next, as shown in FIG. 4, the pulse is read by the pMOS transistor p2 and the nMOS transistor n3 of the tri-state inverter T1, and states of the pMOS transistor p2 and the nMOS transistor n3 are inverted. Furthermore, the pulse passing through the transmission gate TG causes states of the pMOS transistor p5 and the nMOS transistor n5 of the inverter IN2 to be inverted.

Figure 5:
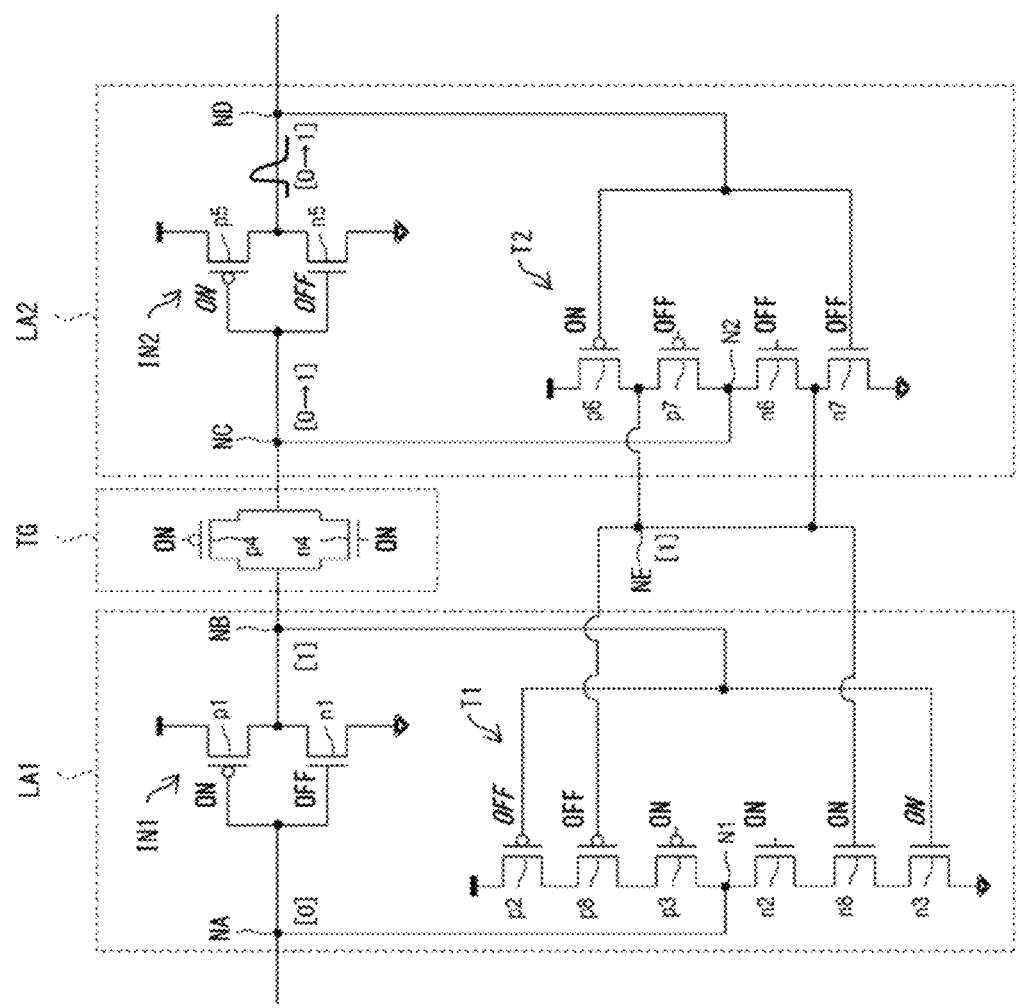
FIG. 5 is a diagram illustrating the mechanism for suppressing the soft error of the D-type flip-flop circuit.

Thus, as shown in FIG. 5, the pulse inverted by the inverter IN2 (hereinafter referred to as a "first inversion pulse") causes the potential of the node ND to switch from [0] to [1]. At this time, since the inverter IN2 functions as a delay circuit, the inverted states of the pMOS transistor p2 and nMOS transistor n3 return to the initial states.

Figure 6:
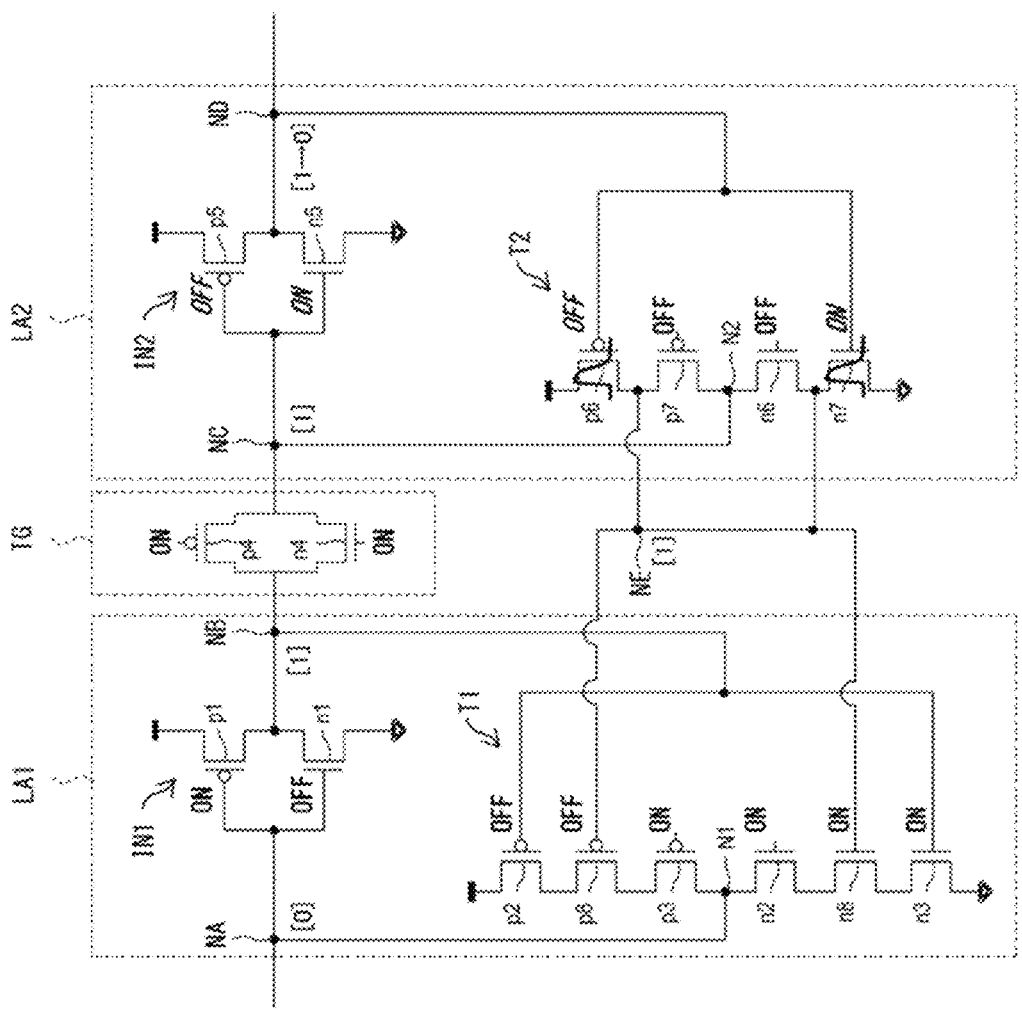
FIG. 6 is a diagram illustrating the mechanism for suppressing the soft error of the D-type flip-flop circuit.

Next, as shown in FIG. 6, the first inversion pulse is read by the pMOS transistor p6 and the nMOS transistor n7 of the tri-state inverter T2, and the states of the pMOS transistor p6 and the nMOS transistor n7 are inverted.

Figure 7:
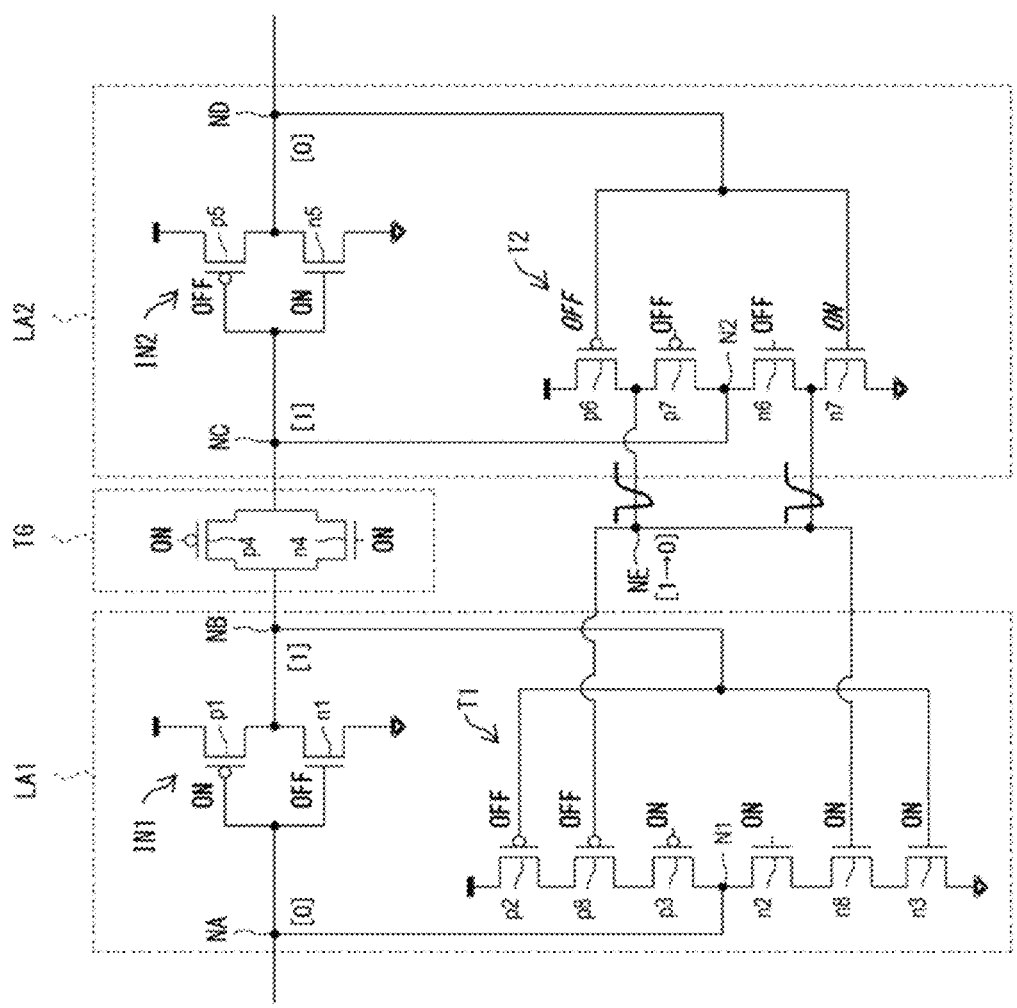
FIG. 7 is a diagram illustrating the mechanism for suppressing the soft error of the D-type flip-flop circuit.

Thus, as shown in FIG. 7, a pulse further inverted by the tri-state inverter T2 (hereinafter referred to as a "second inversion pulse") causes the potential of the node NE to switch from [1] to [0].

Figure 8:
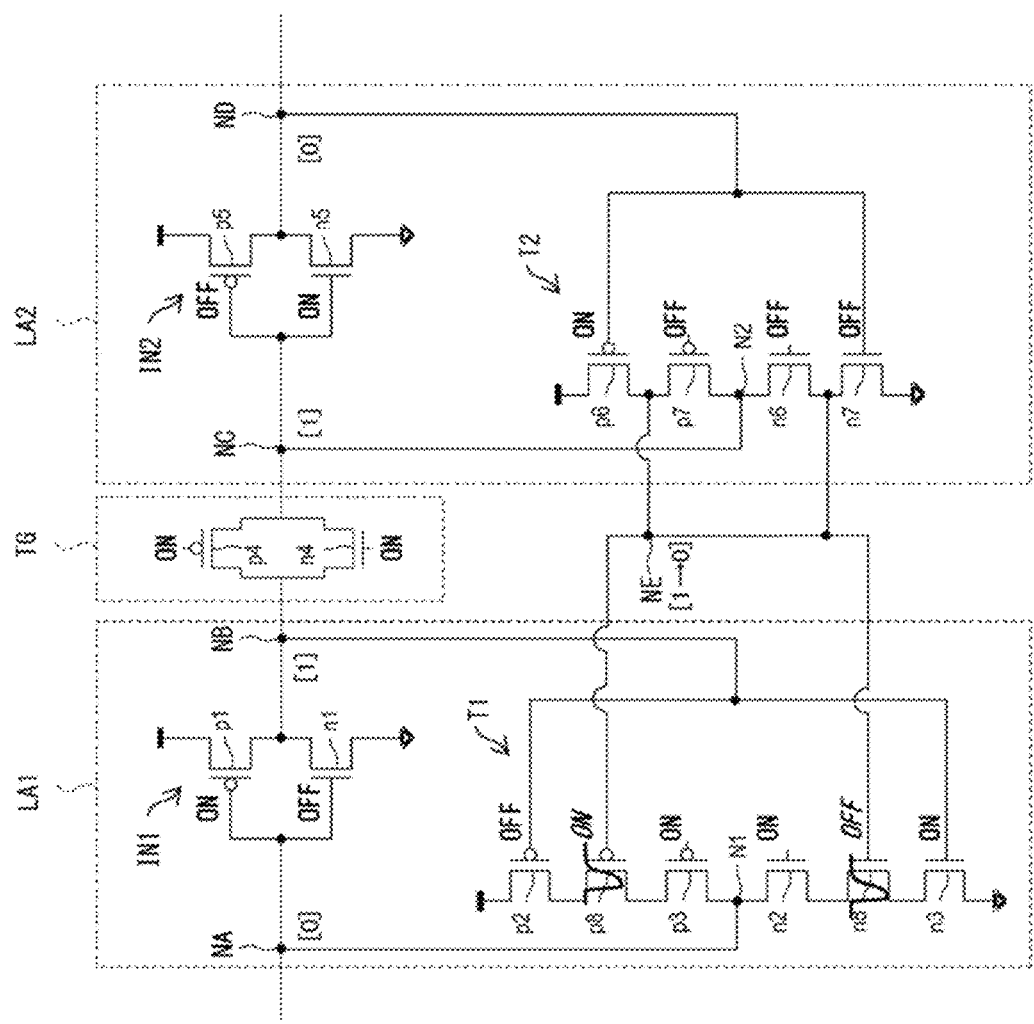
FIG. 8 is a diagram illustrating the mechanism for suppressing the soft error of the D-type flip-flop circuit.

Next, as shown in FIG. 8, the second inversion pulse is read by the pMOS transistor p8 and the nMOS transistor n8 of the tri-state inverter T1, and states of the pMOS transistor p8 and the nMOS transistor n8 are inverted. However, since the pMOS transistor p2 and the nMOS transistor n3 are respectively OFF and ON, the state of the node NA does not change. Therefore, the holding value of the master latch LA1 can be continuously the value of "1".

In this way, when a soft error causes a pulse to occur, the pMOS transistor p2 and the pMOS transistor p8 of the tri-state inverter T1, and the nMOS transistor n3 and the nMOS transistor n8 are temporarily inverted. However, since the inverter IN2 and the tri-state inverter T2 through which the pulse passes function as a delay circuit, the pMOS transistor p2 and the pMOS transistor p8, and the nMOS transistor n3 and the nMOS transistor n8 do not invert simultaneously. Thus, the holding value of the master latch LA1 are as normal without switching.

As described above, the master latch LA1 of the D-type flip-flop circuit 1 has a structure in which two MOSs are added to the general D-type flip-flop circuit 10 shown in FIG. 22. By studying the wiring, the former has the same tolerance to a soft error as the master latch LA21 of the conventional D-type flip-flop circuit 20 with enhanced tolerance to a soft error as shown in FIG. 23. Furthermore, as described above, the D-type flip-flop circuit 1 can greatly suppress an increase in the circuit area compared to the D-type flip-flop circuit 20. Furthermore, since the D-type flip-flop circuit 1 is not provided with a delay circuit between the input part of the master latch LA1 and the output part of the slave latch LA2, the delay time can also be reduced. Therefore, compared with the conventional D-type flip-flop circuit 20 with enhanced tolerance to a soft error, it can suppress an increase in the circuit area and delay time and have higher tolerance to a soft error.

(Variation 1)

Figure 9:
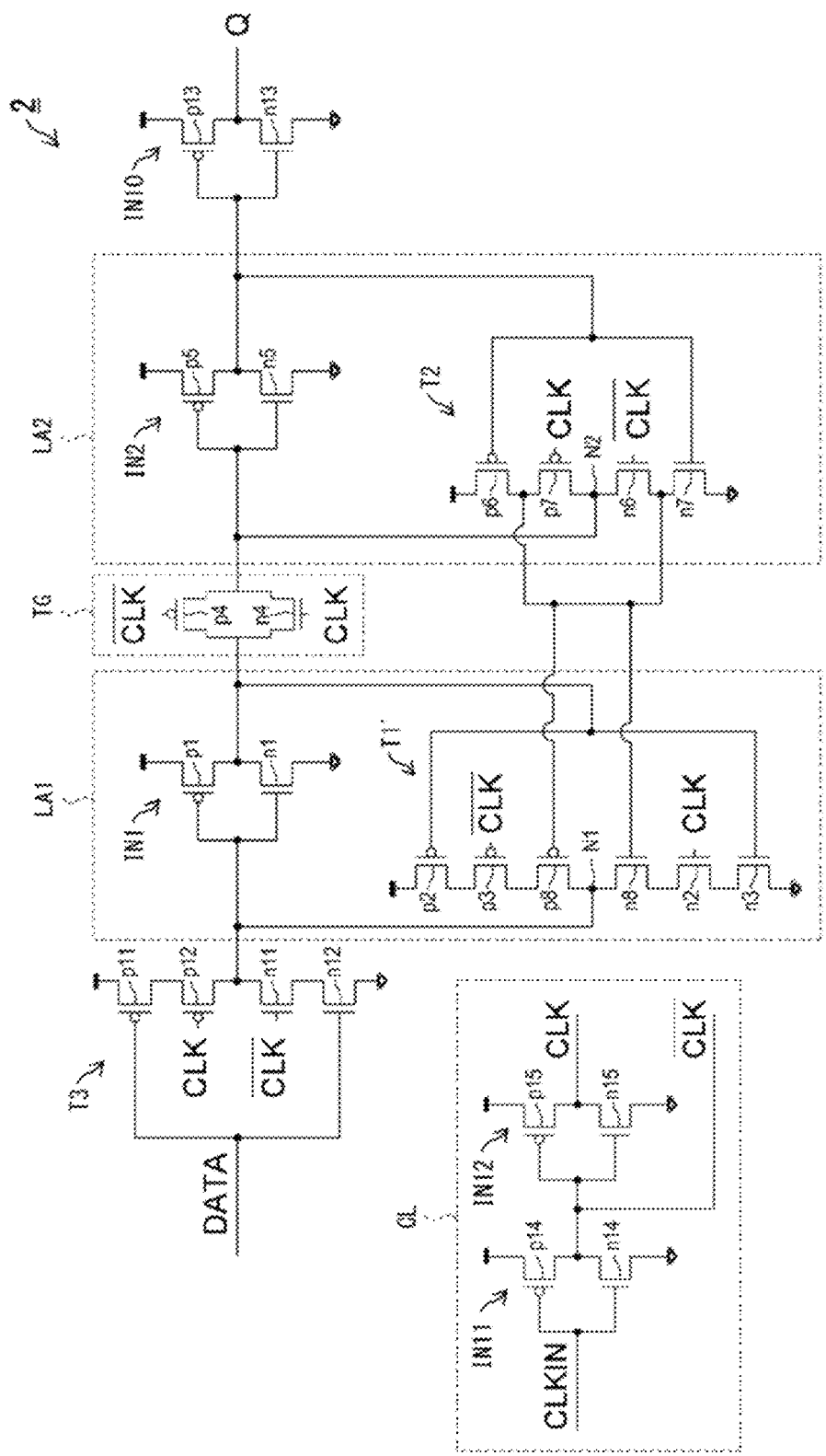
FIG. 9 is a circuit diagram of a D-type flip-flop circuit according to variation 1.

FIG. 9 is a circuit diagram of a D-type flip-flop circuit 2 according to the variation 1. The D-type flip-flop circuit 2 has a structure in which the tri-state inverter T1 in the D-type flip-flop circuit 1 shown in FIG. 1 is replaced with a tri-state inverter T1'. In the tri-state inverter T1', the source (one of the source and the drain) and the drain (the other of the source and the drain) of the pMOS transistor p8 are respectively connected to the source (the other of the source and the drain) of the nMOS transistor n3 and the node N1. Furthermore, the drain (one of the source and the drain) and the source (the other of the source and the drain) of the nMOS transistor n8 are respectively connected to the node N1 and the drain (one of the source and the drain) of the nMOS transistor n2. That is, the tri-state inverter T1' has a structure in which the pMOS transistor p8 and the pMOS transistor p3 are exchanged, and the nMOS transistor n8 and the nMOS transistor n3 are exchanged in the tri-state inverter T1 shown in FIG. 1.

As described above, as long as the pMOS transistor p2 and the pMOS transistor p8, and the nMOS transistor n3 and the nMOS transistor n8 are not inverted simultaneously, the holding values of the master latch LA1 and the slave latch LA2 are as normal without switching. In the D-type flip-flop circuit 2 shown in FIG. 9, the distance between the pMOS transistor p2 and the pMOS transistor p8 and the distance between the nMOS transistor n3 and the nMOS transistor n8 are larger than those in the D-type flip-flop circuit 1 shown in FIG. 1. Therefore, it can reduce the probability that the pMOS transistor p2 and the pMOS transistor p8, or the nMOS transistor n3 and the nMOS transistor n8 are simultaneously inverted by one particle beam, and the tolerance to a soft error can be further improved.

(Variation 2)

In the D-type flip-flop circuits 1 and 2 described above, the tolerance to a soft error of the master latch LA1 is improved. In the variation 2, a structure for improving the tolerance to a soft error of the slave latch LA2 will be described.

Figure 10:
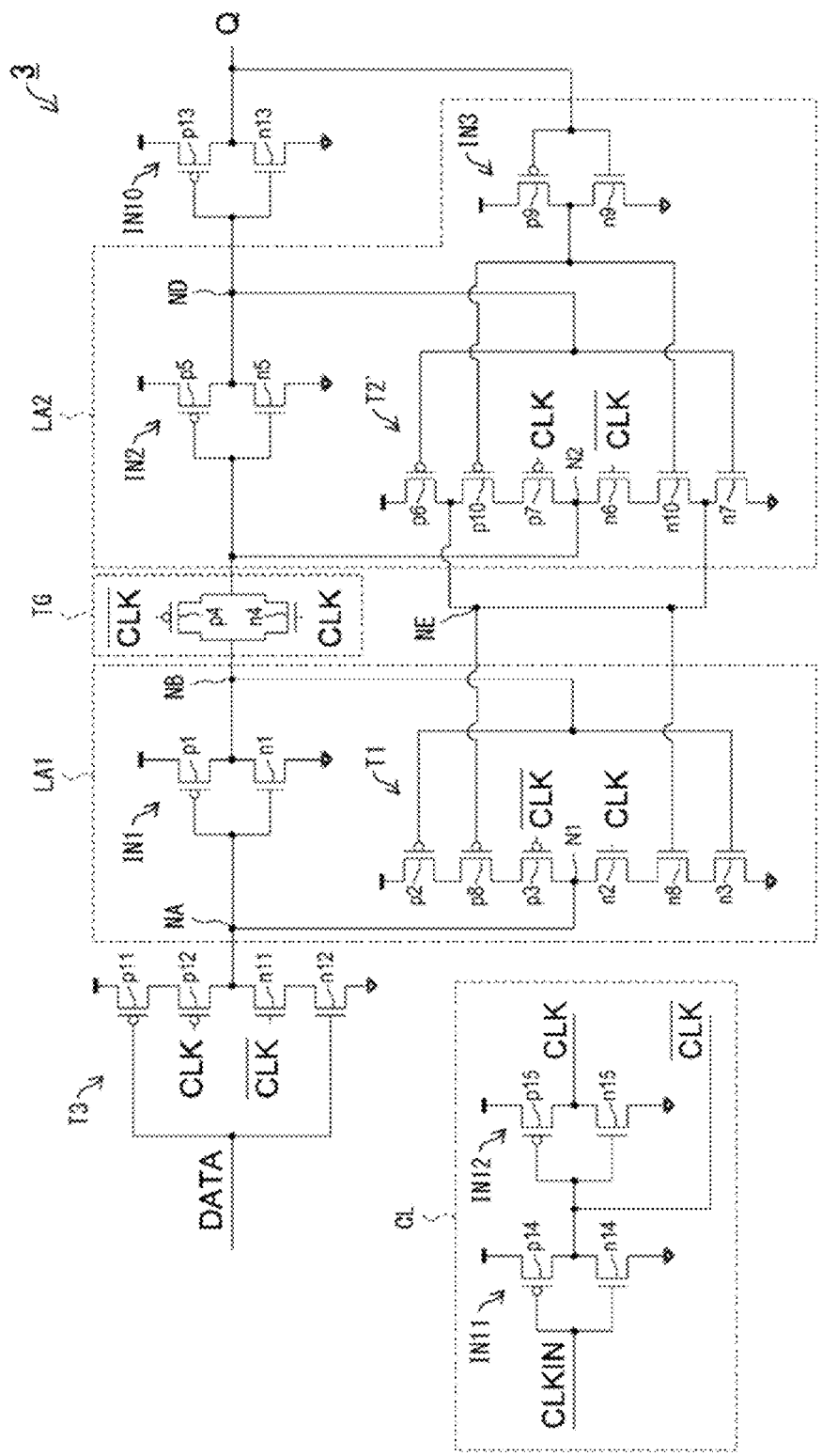
FIG. 10 is a circuit diagram of a D-type flip-flop circuit according to variation 2.

FIG. 10 is a circuit diagram of a D-type flip-flop circuit 3 according to the variation 2. The structure of the D-type flip-flop circuit 3 differs from that of the D-type flip-flop circuit 1 shown in FIG. 1 in that the slave latch LA2 further comprises an inverter IN3, and the tri-state inverter T2 is replaced with a tri-state inverter T2'. The inverter IN3 comprises a pMOS transistor p9 and an nMOS transistor n9. The source (one of the source and the drain) of the pMOS transistor p9 is connected to the power supply potential, and the drain (one of the source and the drain) of the nMOS transistor n9 is connected to the drain (the other of the source and the drain) of the pMOS transistor p9, and the source (the other of the source and the drain) of the nMOS transistor n9 is grounded. The gate of the nMOS transistor n9 is connected to the gate of the pMOS transistor p9. The gate of the pMOS transistor p9 and the gate of the nMOS transistor n9 are connected to the output part of the slave latch LA2 via an inverter IN10. That is, an inverted signal of an output signal from the output part of the slave latch LA2 is inputted at the gate of the pMOS transistor p9 and the gate of the nMOS transistor n9.

The tri-state inverter T2' further comprises a pMOS transistor p10 and an nMOS transistor n10. The source (one of the source and the drain) and the drain (the other of the source and the drain) of the pMOS transistor p10 are respectively connected to the drain (the other of the source and the drain) of the pMOS transistor p6 and the source (one of the source and the drain) of the pMOS transistor p7. Furthermore, the drain (one of the source and the drain) and the source (the other of the source and the drain) of the nMOS transistor n10 are respectively connected to the drain (the other of the source and the drain) of the nMOS transistor n6 and the drain (one of the source and the drain) of the nMOS transistor n7. The gate of the pMOS transistor p10 and the gate of the nMOS transistor n10 are connected to each other, and are connected to the drain (the other of the source and the drain) of the pMOS transistor p9 and the drain (one of the source and the drain) of the nMOS transistor n9.

According to the above structure, in the D-type flip-flop circuit 3, even if the state of any MOS of the inverter IN2 of the slave latch LA2 is inverted and a pulse is generated due to a soft error, since the inverter IN10 and the inverter IN3 function as a delay circuit, the pMOS transistor p6 and the pMOS transistor p10, and the nMOS transistor n7 and the nMOS transistor n10 do not invert simultaneously. Therefore, by adding only four MOSs, the tolerance to a soft error of the slave latch LA2 can be improved.

(Variation 3)

Figure 11:
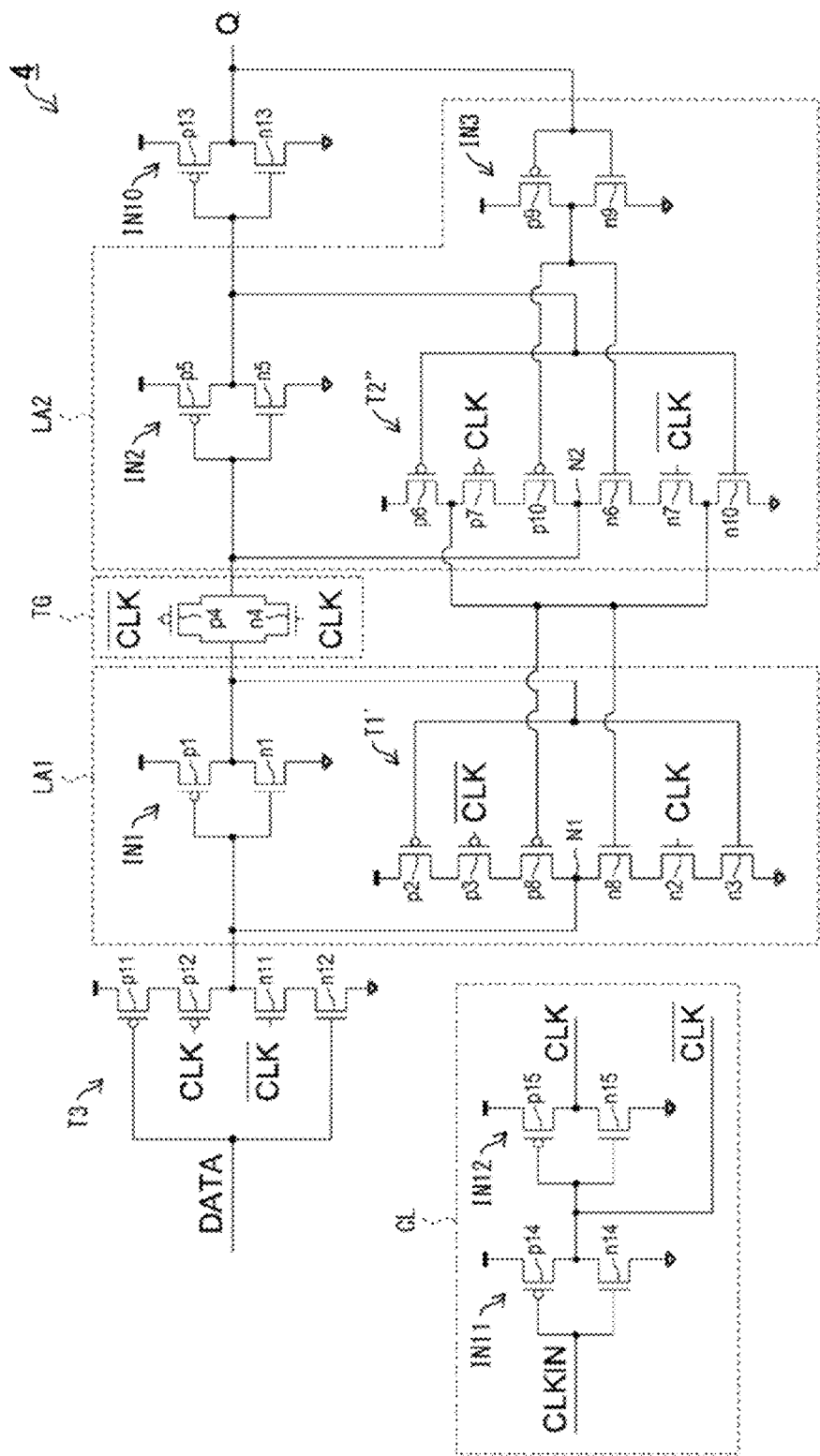
FIG. 11 is a circuit diagram of a D-type flip-flop circuit according to variation 3.

FIG. 11 is a circuit diagram of a D-type flip-flop circuit 4 according to the variation 3. The structure of the D-type flip-flop circuit 4 differs from that of the D-type flip-flop circuit 3 shown in FIG. 10 in that the tri-state inverter T1 is replaced with a tri-state inverter T1' and the tri-state inverter T2' is replaced with a tri-state inverter T2". The tri-state inverter T1' is the same as that shown in FIG. 9. In the tri-state inverter T2", the source (one of the source and the drain) and the drain (the other of the source and the drain) of the pMOS transistor p10 are respectively connected to the drain (the other of the source and the drain) of the pMOS transistor p7 and the node N2, and the drain (one of the source and the drain) and the source (the other of the source and the drain) of the nMOS transistor n10 are respectively connected to the node N2 and the drain (one of the source and the drain) of the nMOS transistor n6.

In the D-type flip-flop circuit 4 shown in FIG. 11, the distance between the pMOS transistor p6 and the pMOS transistor p10 and the distance between the nMOS transistor n6 and the nMOS transistor n10 are larger than those in the D-type flip-flop circuit 3 shown in FIG. 10. Therefore, it can reduce the probability that the pMOS transistor p6 and the pMOS transistor p10, or the nMOS transistor n6 and the nMOS transistor n10 are simultaneously inverted by one particle beam, and thus the tolerance to a soft error can be further improved.

SUMMARY

Table 1 shows the performances (at a power supply voltage of 1.2V, process 65 nmFDSOI) of the general D-type flip-flop circuit 10 shown in FIG. 22, the conventional D-type flip-flop circuit 20 with enhanced tolerance to a soft error shown in FIG. 23, the D-type flip-flop circuit 1 according to the above embodiment, and D-type flip-flop circuit 3.

TABLE 1

|  | Delay Time | Dynamic Power | Area | Number of Transistors |
| --- | --- | --- | --- | --- |
| D-type flip-flop circuit 10 | 1 | 1 | 1 | 24 |
| D-type flip-flop circuit 20 | 2.20 (1) | 1.06 (1) | 1.47 (1) | 36 |
| D-type flip-flop circuit 1 | 1.06 (0.48) | 1.08 (0.97) | 1.06 (0.72) | 26 |
| D-type flip-flop circuit 3 | 1.08 (0.49) | 1.02 (0.96) | 1.18 (0.80) | 30 |

The values of the delay time, the dynamic power, and the area are relative values when the D-type flip-flop circuit 10 is set to 1, and the values in parentheses are relative values when the D-type flip-flop circuit 20 is set to 1. In the D-type flip-flop circuit 1 and the D-type flip-flop circuit 3, compared with the conventional D-type flip-flop circuit 20, the delay time is reduced by about 50%, and the cost in area is reduced by about 20%. Furthermore, as shown in the embodiments described below, the D-type flip-flop circuit 3 has the same tolerance to a soft error as the D-type flip-flop circuit 20.

As described above, compared with the conventional D-type flip-flop circuit 20 with enhanced tolerance to a soft error, the D-type flip-flop circuits 1 to 4 according to the embodiments can suppress the increase in circuit area and delay time, and have the same tolerance to a soft error.

As mentioned above, although embodiments and variations of the present invention has been described, the invention is not limited to the described embodiments and variations, and various modifications can be made without departing from the principle of the present invention. Therefore, a method obtained by appropriately combining the technical means disclosed in the above-described embodiments and variations also belongs to the technical scope of the present invention.

Figure 18:
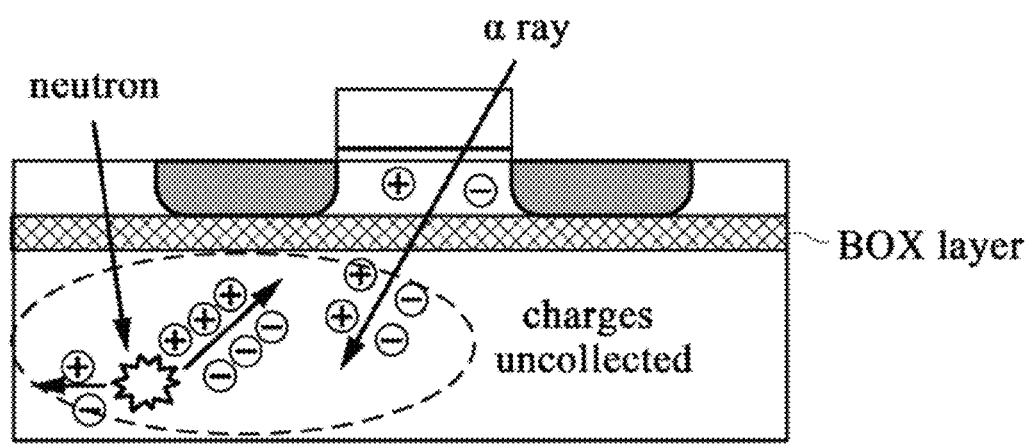
FIG. 18 is a diagram schematically showing the structure of a semiconductor chip provided with a BOX layer.
Figure 19:
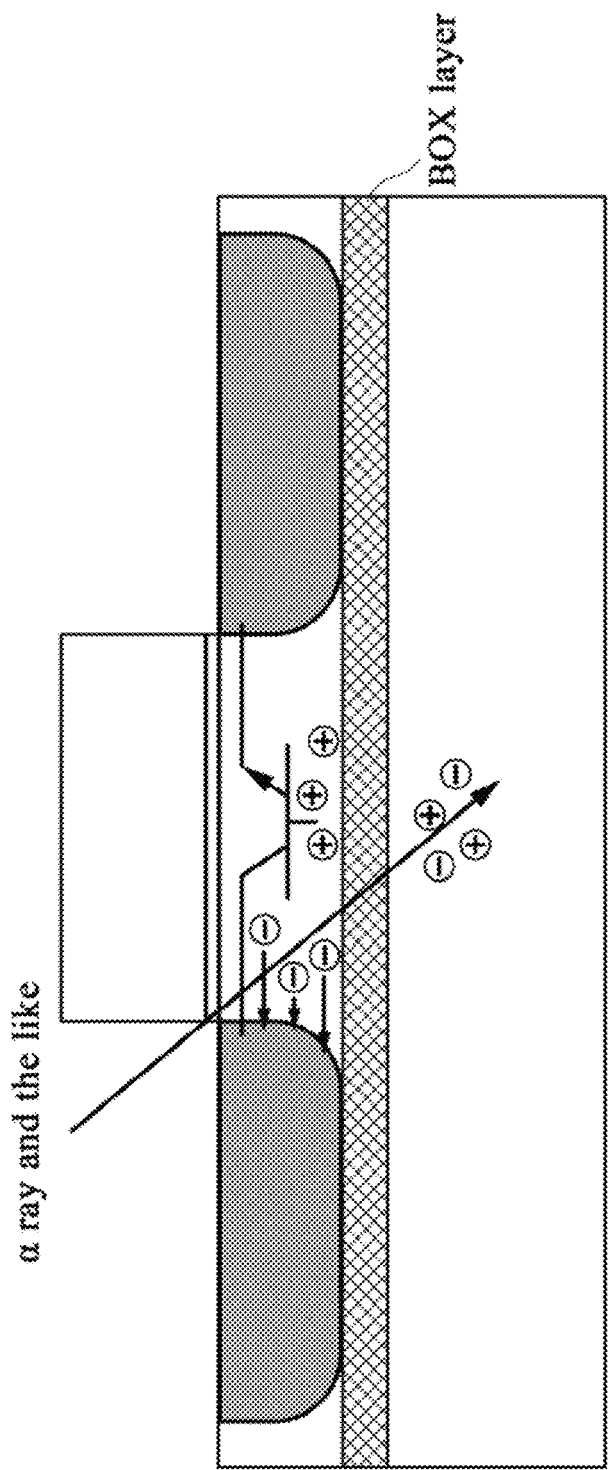
FIG. 19 is a diagram illustrating a soft error caused by parasitic bipolar effects.
Figure 20:
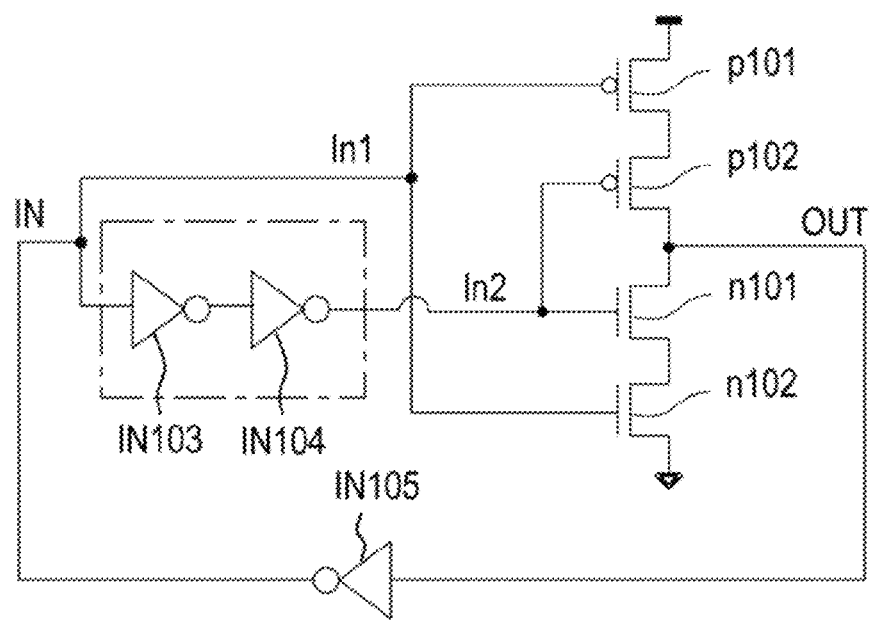
FIG. 20 is an example of a circuit in which a non-multiplexing countermeasure using a C component has been implemented.
Figure 21:
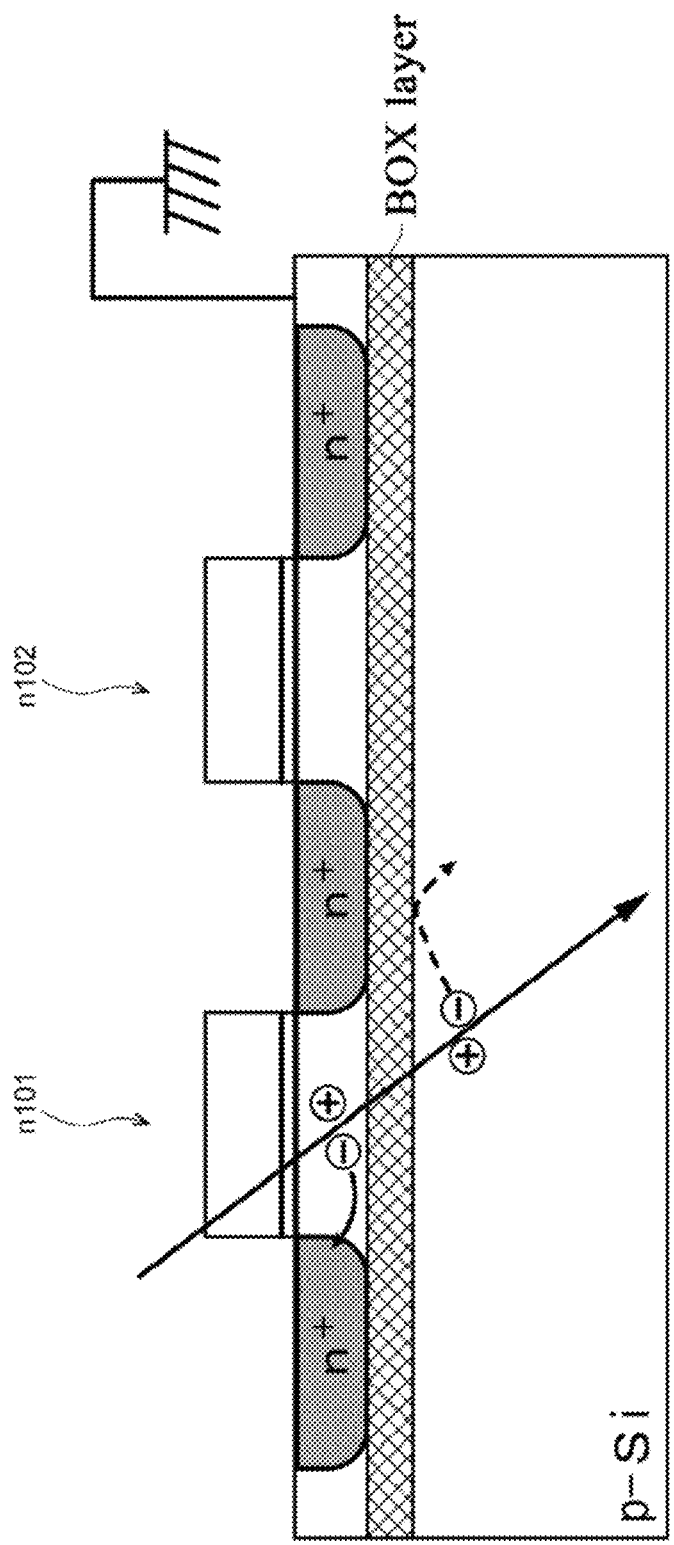
FIG. 21 is a diagram illustrating the non-multiplexing countermeasure using a C component.

Furthermore, in the above embodiments, each MOS transistor has the FD-SOI structure shown in FIG. 18, but it may also have a bulk structure.

EMBODIMENTS

Embodiment 1

In embodiment 1, a device simulation tool (TCAD, Technology Computer Aided Design) verified that the D-type flip-flop circuit 3 shown in FIG. 10 has sufficient tolerance to a soft error. In TCAD, Synopsys® Sentaurus was used. Specifically, the Sentaurus Structure Editor was used to build the structure of the device in 3D according to the layout, and the Sentaurus Device was used to evaluate the particle beam collision.

Figure 12:
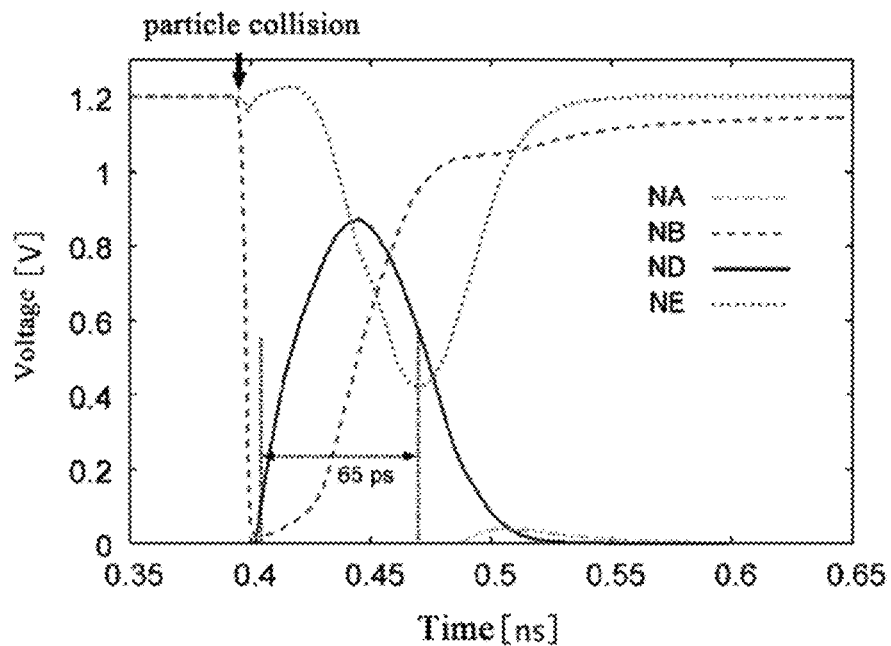
FIG. 12 is a graph showing changes in potentials of nodes NA, NB, ND, and NE of the D-type flip-flop circuit shown in FIG. 10 over time when radiation collides with the nMOS transistor n1.

In the evaluation of the particle beam collision, the inverter IN1 shown in FIG. 10 is established in 3D, and the tri-state inverter T1, the transmission gate TG, the inverter IN2, the tri-state inverter T2, the inverter IN3, and inverter IN10 are established with a circuit model. The power supply voltage is 1.2V. In the initial state, the potentials of the nodes NA, NB, ND, and NE are respectively set to 0V, 1.2V, 0V, and 1.2V. Then, charged particles of 60 MeV-cm$^2$/mg collide with the nMOS transistor n1, and the changes in the potential of the nodes NA, NB, ND, and NE over time are investigated. The results are shown in FIG. 12.

Since the inverter IN2 and the tri-state inverter T2' function as a delay circuit, it takes 65 ps from the collision of the particle beam to the potential of the node NE changing to a low level (about 0.4V). At this moment, since the potential of the node NB returns to a high level (approximately 1.0V), the pMOS transistor p2 and the pMOS transistor p8, and the nMOS transistor n3 and the nMOS transistor n8 do not invert simultaneously, and the potential of the node NA is almost unchanged.

In this way, it can be known that in the D-type flip-flop circuit 3, even if the charged particles of 60 MeV·cm$^2$/mg collide, the holding value is not inverted.

Furthermore, as a comparative example, the tolerance to a soft error of the general D-type flip-flop circuit 10 shown in FIG. 22 is also verified. Specifically, the inverter IN1 shown in FIG. 22 is established in 3D, and the tri-state inverter T11, the transmission gate TG, the inverter IN2, the tri-state inverter T12, and the inverter IN10 are established with a circuit model. The power supply voltage is set to 1.2V, and the potential of the node NB is set to 1.2V in the initial state. Then, charged particles of 5.8 or 5.9 MeV·cm$^2$/mg collide with the nMOS transistor n1, and the change in the potential of the node NB over time is investigated. The results are shown in FIG. 13.

Figure 13:
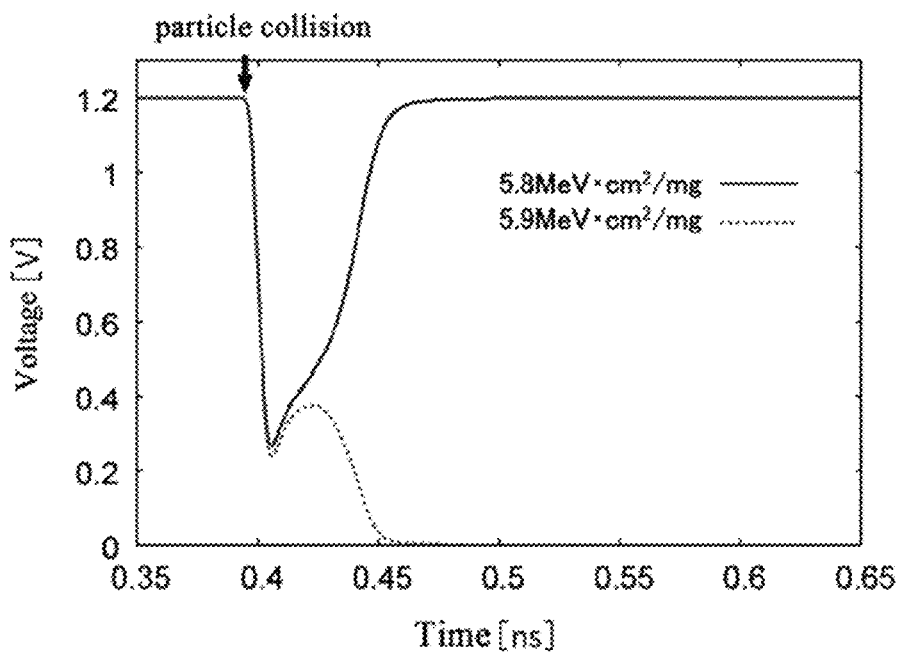
FIG. 13 is a graph showing changes in the potential of the node NB of the general D-type flip-flop circuit shown in FIG. 22 over time when radiation collides with the nMOS transistor n1.
Figure 14:
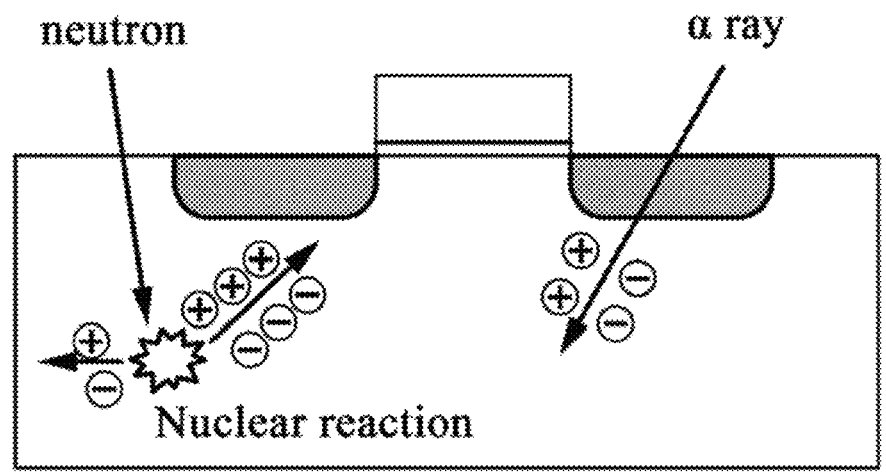
FIG. 14 is a diagram illustrating the principle of occurrence of a soft error.
Figure 15:
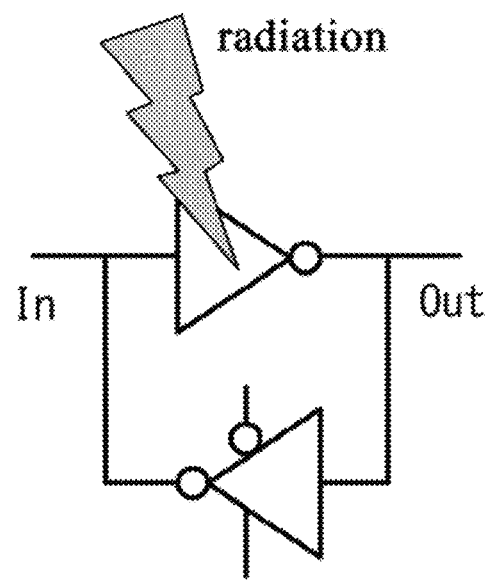
FIG. 15 is a diagram schematically showing a case where radiation passes through a transistor.
Figure 16:
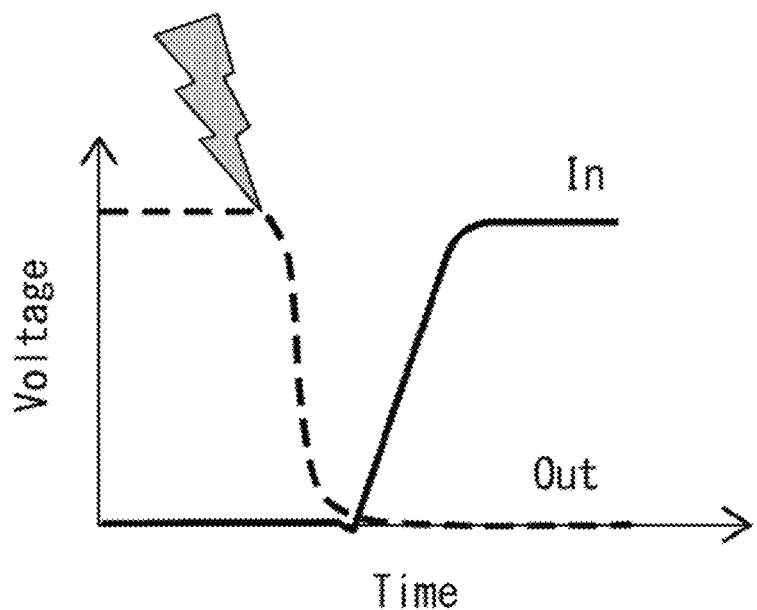
FIG. 16 is a diagram showing a case where the output voltage of the transistor is inverted due to radiation.
Figure 17:
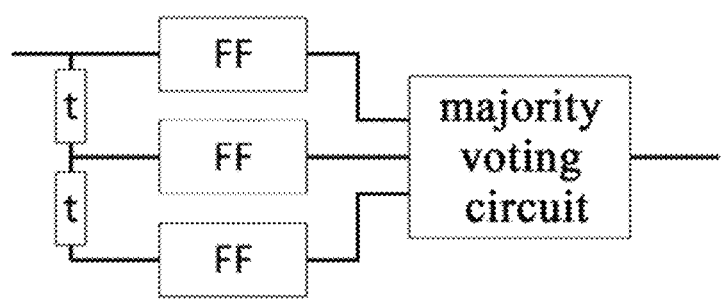
FIG. 17 is a diagram schematically showing a circuit in which a flip-flop circuit is tripled.

It can be seen from FIG. 13 that for the general D-type flip-flop circuit 10, even if the charged particles collide with $\frac{1}{10}$ (about 6 McV·cm$^2$/mg) of the energy of the charged particles of the embodiment 1, the holding value is inverted. That is, it can be seen that the D-type flip-flop circuit 3 has tolerance to a soft error that is ten or more times larger than that in general D-type flip-flop circuit 10.

In this way, in a general D-type flip-flop circuit, pulses generated by the collision of charged particles affect a wide range of MOS transistors. On the other hand, the D-type flip-flop circuit according to the present invention has a structure in which two MOS transistors are added to the general D-type flip-flop circuit. However, by studying the wiring, the effect of the pulse generated by the collision of the charged particles is limited to a small range. That is, the present inventors discovered for the first time that by adding two MOS transistors, the tolerance to a soft error can be drastically improved.

Embodiment 2

Figure 24:
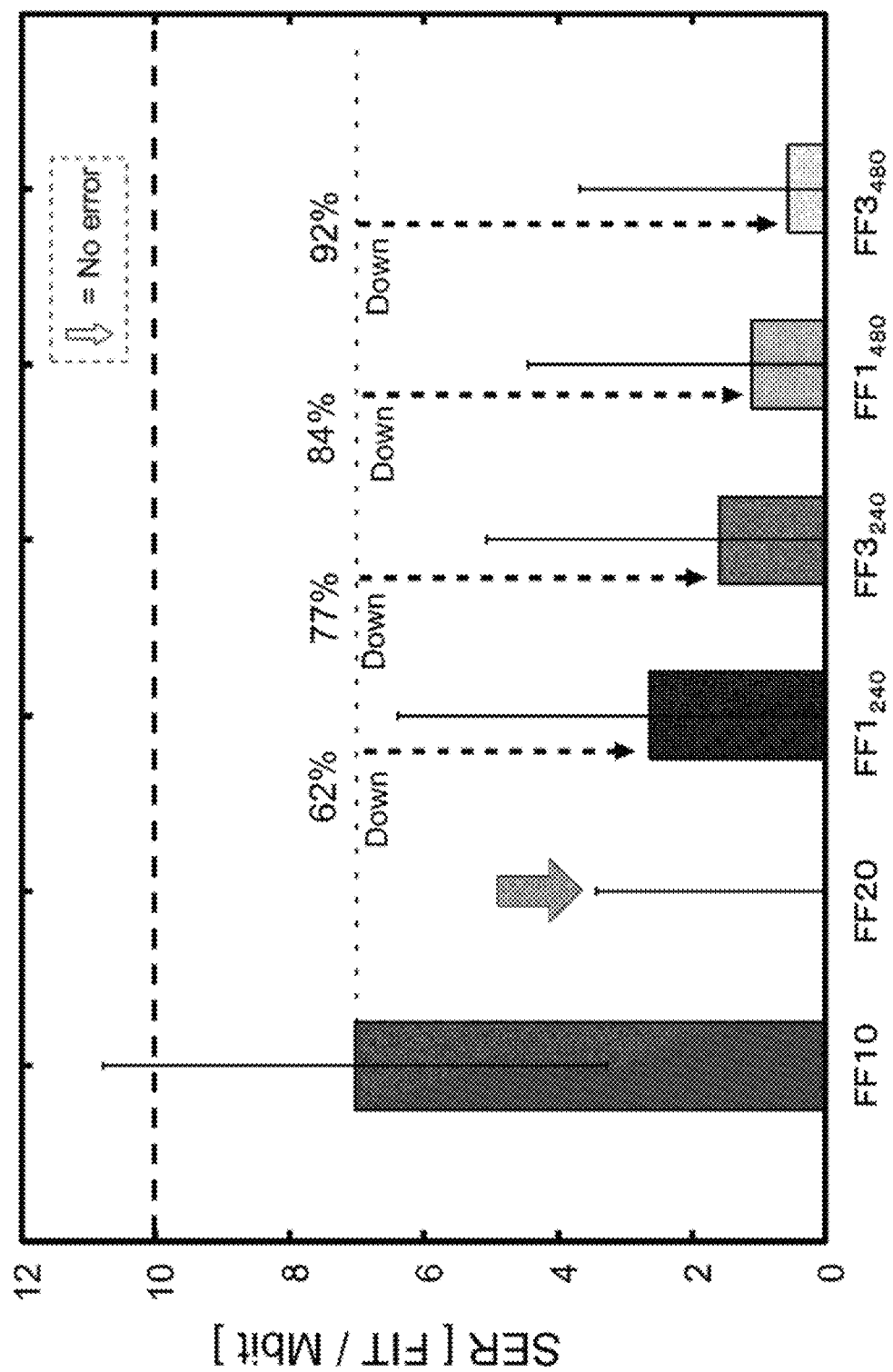
FIG. 24 is a graph showing the measurement results of embodiment 2.

In the embodiment 2, in order to verify that the D-type flip-flop circuit according to the present invention satisfies the reliability required for automatic driving, a reliability test by neutron beam irradiation was performed. Specifically, the D-type flip-flop circuit 1 (the distance between transistors D1=240 nm, hereinafter referred to as "FF1$_{240}$") and D-type flip-flop circuit 1 (the distance between transistors D1=480 nm, hereinafter referred to as "FF1$_{480}$") shown in FIG. 1, D-type flip-flop circuit 3 (the distance between transistors D1=240 nm, hereinafter referred to as "FF3$_{240}$"), D-type flip-flop circuit 3 (the distance between transistors D1=480 nm, hereinafter referred to as "FF3$_{480}$") shown in FIG. 3 are irradiated with white neutrons (with an acceleration coefficient of 3.77×10$^8$), and FIT values were measured for each circuit. Furthermore, as a comparative example, the D-type flip-flop circuit 10 (hereinafter referred to as "FF10") shown in FIG. 22 and the D-type flip-flop circuit 20 (hereinafter referred to as "FF20") shown in FIG. 23 were also irradiated with white neutron beams (with an acceleration coefficient of 3.77×10$^8$), and FIT values were measured for each circuit. The power supply voltage is 0.6V in any circuit. The measurement results are shown in Table 2 and FIG. 24.

TABLE 2

| Circuit | FIT Value (α) |
| --- | --- |
| FF10 | 6.68 (4.30) |
| FF20 | 0.00 (3.09) |
| FF1$_{240}$ | 2.31 (3.85) |
| FF1$_{480}$ | 1.81 (3.56) |
| FF3$_{240}$ | 1.63 (3.46) |
| FF3$_{480}$ | 1.12 (3.22) |

In contrast, in the road vehicle functional safety standard ISO26262, the FIT values shown in Table 3 are determined according to car parts (1FIT: a chip fails with an average probability of once per 10$^9$ hours).

TABLE 3

| Level | FIT Value | Object |
| --- | --- | --- |
| ASIL - A | <1000 | Convenient functions such as rearview mirror |
| ASIL - B, C | <100 | Safety-related functions (brake, dashboard) |
| ASIL - D | <10 | Autopilot (Google Car, Tesla) |

It can be known that the circuits (FF1$_{240}$, FF1$_{480}$, FF3$_{240}$, FF3$_{480}$) according to the embodiment are all within the range of 10 FIT/Mbit and meet ASIL-D. On the other hand, in the conventional general circuit (FF10), the upper limit of the error range exceeds 10 FIT/Mbit. Furthermore, although the conventional circuit (FF20) that implements a non-multiplexing countermeasure satisfies ASIL-D, it cannot be applied to systems that use high-frequency clocks because of the large circuit area and delay time.

As described above, it can be known that the D-type flip-flop circuit according to the present invention has tolerance to a soft error that fully meets the safety standards of automatic driving while suppressing the increase in circuit area and delay time.

INDUSTRIAL APPLICABILITY

The D-type flip-flop circuit of the present invention can be applied to all electrical devices, especially suitable for automobiles, aircrafts, spacecrafts, medical devices, etc. that require tolerance to a soft error.

LIST OF REFERENCE NUMBERS

1: D-type flip-flop circuit
2: D-type flip-flop circuit
3: D-type flip-flop circuit
4: D-type flip-flop circuit
10: D-type flip-flop circuit
20: D-type flip-flop circuit
CL: Clock signal generation circuit
IN1: inverter (first inverter)
IN2: inverter (second inverter)
IN3: inverter (third inverter)
IN10: Inverter
IN11: Inverter
IN12: Inverter
LA1: Master latch
LA2: Slave latch
N0: Node
N1: Node (first node)
N2: node (second node)
NA: Node
NB: Node
NC: Node
ND: Node
NE: Node
T1: Tri-state inverter (first tri-state inverter)
T1': Tri-state inverter (first tri-state inverter)
T2: Tri-state inverter (second tri-state inverter)
T2': Tri-state inverter (second tri-state inverter)
T2": Tri-state inverter (second tri-state inverter)
T3: Tri-state inverter
TG: Transmission gate
n1-n10: nMOS transistor
n11-n15: nMOS transistor
p1-p10: pMOS transistor
p11-p15: pMOS transistor.

What is claimed is:
1. A D-type flip-flop circuit, comprising:
a master latch, a transmission gate and a slave latch,
wherein, the master latch comprises a first inverter and a first tri-state inverter,
the first inverter comprises a first pMOS transistor and a first nMOS transistor,
one of a source and a drain of the first pMOS transistor is connected to a power supply potential,
one of a source and a drain of the first nMOS transistor is connected to the other of the source and the drain of the first pMOS transistor, the other of the source and the drain of the first nMOS transistor is grounded, and a gate of the first nMOS transistor is connected to a gate of the first pMOS transistor,
the first tri-state inverter comprises a second pMOS transistor, a third pMOS transistor, a second nMOS transistor, and a third nMOS transistor,
one of a source and a drain of the second pMOS transistor is connected to the power supply potential,
one of a source and a drain of the third pMOS transistor is directly or indirectly connected to the other of the source and drain of the second pMOS transistor, and the other of the source and the drain of the third pMOS transistor is directly or indirectly connected to a first node, and an inverted clock signal is inputted to a gate of the third pMOS transistor,
the first node is connected to the gate of the first pMOS transistor and the gate of the first nMOS transistor, and the first node, the gate of the first pMOS transistor and the gate of the first nMOS transistor together constitute an input part of the master latch,
one of a source and a drain of the second nMOS transistor is directly or indirectly connected to the first node, and a clock signal is inputted to a gate of the second nMOS transistor,
one of a source and a drain of the third nMOS transistor is directly or indirectly connected to the other of the source and the drain of the second nMOS transistor, and the other of the source and the drain of the third nMOS transistor is grounded,
a gate of the second pMOS transistor and a gate of the third nMOS transistor are connected to each other to constitute an output part of the master latch, and are connected to the other of the source and the drain of the first pMOS transistor and to the one of the source and the drain of the first nMOS transistor,
the transmission gate comprises a fourth pMOS transistor and a fourth nMOS transistor,
one of a source and a drain of the fourth pMOS transistor and one of a source and a drain of the fourth nMOS transistor are connected to each other to constitute an input part of the transmission gate, and are connected to the output part of the master latch,
the other of the source and the drain of the fourth pMOS transistor and the other of the source and the drain of the fourth nMOS transistor are connected to each other to constitute an output part of the transmission gate,
the slave latch comprises a second inverter and a second tri-state inverter,
the second inverter comprises a fifth pMOS transistor and a fifth nMOS transistor,
one of a source and a drain of the fifth pMOS transistor is connected to the power supply potential,
one of a source and a drain of the fifth nMOS transistor is connected to the other of the source and the drain of the fifth pMOS transistor, the other of the source and drain of the fifth nMOS transistor is grounded, and a gate of the fifth nMOS transistor is connected to a gate of the fifth pMOS transistor,
the second tri-state inverter comprises a sixth pMOS transistor, a seventh pMOS transistor, a sixth nMOS transistor, and a seventh nMOS transistor,
one of a source and a drain of the sixth pMOS transistor is connected to the power supply potential,
one of a source and a drain of the seventh pMOS transistor is directly or indirectly connected to the other of the source and the drain of the sixth pMOS transistor, and the other of the source and the drain of the seventh pMOS transistor is directly or indirectly connected to a second node, and the clock signal is inputted to a gate of the seventh pMOS transistor,
the second node is connected to the gate of the fifth pMOS transistor and the gate of the fifth nMOS transistor, and the second node, the gate of the fifth pMOS transistor and the gate of the fifth nMOS transistor together constitute an input part of the slave latch, one of a source and a drain of the sixth nMOS transistor is directly or indirectly connected to the second node, and the inverted clock signal is inputted to a gate of the sixth nMOS transistor, one of a source and a drain of the seventh nMOS transistor is directly or indirectly connected to the other of the source and the drain of the sixth nMOS transistor, and the other of the source and the drain of the seventh nMOS transistor is grounded, a gate of the sixth pMOS transistor and a gate of the seventh nMOS transistor are connected to each other to constitute an output part of the slave latch, and are connected to the other of the source and the drain of the fifth pMOS transistor, the one of the source and the drain of the fifth nMOS transistor, and the output part of the transmission gate, in the D-type flip-flop circuit, the first tri-state inverter further comprises an eighth pMOS transistor and an eighth nMOS transistor, one and the other of a source and a drain of the eighth pMOS transistor are respectively connected to the other of the source and the drain of the second pMOS transistor and the one of the source and the drain of the third pMOS transistor, or respectively connected to the other of the source and the drain of the third pMOS transistor and the first node, one and the other of a source and a drain of the eighth nMOS transistor are respectively connected to the other of the source and the drain of the second nMOS transistor and the one of the source and the drain of the third nMOS transistor, or respectively connected to the first node and the one of the source and the drain of the second nMOS transistor, a gate of the eighth pMOS transistor and a gate of the eighth nMOS transistor are connected to each other, and are connected to a connection between the other of the source and the drain of the sixth pMOS transistor and the other of the source and the drain of the seventh pMOS transistor and a connection between the other of the source and the drain of the sixth nMOS transistor and the one of the source and the drain of the seventh nMOS transistor.

2. The D-type flip-flop circuit according to claim 1, wherein,
the one and the other of the source and the drain of the eighth pMOS transistor are respectively connected to the other of the source and the drain of the second pMOS transistor and the one of the source and the drain of the third pMOS transistor,
the one and the other of the source and the drain of the eighth nMOS transistor are respectively connected to the other of the source and the drain of the second nMOS transistor and the one of the source and the drain of the third nMOS transistor.

3. The D-type flip-flop circuit according to claim 1, wherein,
the one and the other of the source and the drain of the eighth pMOS transistor are respectively connected to the other of the source and the drain of the third nMOS transistor and the first node,
the one and the other of the source and the drain of the eighth nMOS transistor are respectively connected to the first node and the one of the source and the drain of the second nMOS transistor.

4. The D-type flip-flop circuit according to claim 1, wherein,
the slave latch further comprises a third inverter,
the third inverter comprises a ninth pMOS transistor and a ninth nMOS transistor,
one of a source and a drain of the ninth pMOS transistor is connected to the power supply potential,
one of a source and a drain of the ninth nMOS transistor is connected to the other of the source and the drain of the ninth pMOS transistor, the other of the source and the drain of the ninth nMOS transistor is grounded, and a gate of the ninth nMOS transistor is connected to a gate of the ninth pMOS transistor,
the gate of the ninth pMOS transistor and the gate of the ninth nMOS transistor are inputted with an inverted signal of an output signal from the output part of the slave latch,
the second tri-state inverter further comprises a tenth pMOS transistor and a tenth nMOS transistor,
one and the other of a source and a drain of the tenth pMOS transistor are respectively connected to the other of the source and the drain of the sixth pMOS transistor and the one of the source and the drain of the seventh pMOS transistor, or respectively connected to the other of the source and the drain of the seventh pMOS transistor and the second node,
one and the other of a source and a drain of the tenth nMOS transistor are respectively connected to the other of the source and the drain of the sixth nMOS transistor and the one of the source and the drain of the seventh nMOS transistor, or respectively connected to the second node and the one of the source and the drain of the sixth nMOS transistor,
a gate of the tenth pMOS transistor and a gate of the tenth nMOS transistor are connected to each other and are connected to the other of the source and the drain of the ninth pMOS transistor and the one of the source and the drain of the ninth nMOS transistor.

5. The D-type flip-flop circuit according to claim 4, wherein,
the one and the other of the source and the drain of the tenth pMOS transistor are respectively connected to the other of the source and the drain of the sixth pMOS transistor and the one of the source and the drain of the seventh pMOS transistor,
the one and the other of the source and drain of the tenth nMOS transistor are respectively connected to the other of the source and the drain of the sixth nMOS transistor and the one of the source and the drain of the seventh nMOS transistor.

6. The D-type flip-flop circuit according to claim 4, wherein,
the one and the other of the source and the drain of the tenth pMOS transistor are respectively connected to the other of the source and the drain of the seventh pMOS transistor and the second node,
the one and the other of the source and the drain of the tenth nMOS transistor are respectively connected to the second node and the one of the source and the drain of the sixth nMOS transistor.

* * * * *